(12) United States Patent
Miyashita

(10) Patent No.: US 9,920,889 B2
(45) Date of Patent: Mar. 20, 2018

(54) LIGHTING DEVICE INCLUDING PHOSPHOR COVER AND METHOD OF MANUFACTURING THE SAME

(71) Applicants: CITIZEN ELECTRONICS CO., LTD., Yamanashi-ken (JP); CITIZEN WATCH CO., LTD., Tokyo (JP)

(72) Inventor: Junji Miyashita, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 528 days.

(21) Appl. No.: 14/511,494

(22) Filed: Oct. 10, 2014

(65) Prior Publication Data

US 2015/0103511 A1    Apr. 16, 2015

(30) Foreign Application Priority Data

Oct. 11, 2013   (JP) ................................ 2013-214042
Oct. 11, 2013   (JP) ................................ 2013-214043

(51) Int. Cl.
*F21V 8/00* (2006.01)
*F21K 99/00* (2016.01)
(Continued)

(52) U.S. Cl.
CPC .................. *F21K 9/56* (2013.01); *F21K 9/64* (2016.08); *F21K 9/90* (2013.01); *H01L 33/508* (2013.01);
(Continued)

(58) Field of Classification Search
CPC ..... F21K 9/56; F21K 9/64; F21K 9/90; H01L 33/508
See application file for complete search history.

(56) References Cited

U.S. PATENT DOCUMENTS

2005/0219835 A1    10/2005  Nagayama
2009/0039375 A1     2/2009  LeToquin et al.
(Continued)

FOREIGN PATENT DOCUMENTS

JP    2005-311136    11/2005
JP    2009-177106     8/2009
(Continued)

OTHER PUBLICATIONS

Japanese Notification of Reasons for Refusal dated Jul. 21, 2017 in corresponding Japanese Patent Application 2013-214042 with English translation.
(Continued)

*Primary Examiner* — Anabel Ton
(74) *Attorney, Agent, or Firm* — Wenderoth, Lind & Ponack, L.L.P.

(57) ABSTRACT

In a first aspect of the present inventive subject matter, a lighting device includes a light source including a light-emitting surface, and a phosphor cover including a spiral surface that covers the light-emitting surface of the light source. In a second aspect of the present inventive subject matter, a phosphor cover including a spiral surface may include one or more layers. In a third aspect of the present inventive subject matter, a method manufacturing a lighting device includes: rolling up a phosphor film from one end to another end to form a roll with spiral surfaces both ends of the roll of the phosphor film.

21 Claims, 38 Drawing Sheets

(51) Int. Cl.
- *F21K 9/90* (2016.01)
- *H01L 33/50* (2010.01)
- *F21K 9/64* (2016.01)
- *F21K 9/232* (2016.01)
- *F21Y 115/10* (2016.01)

(52) U.S. Cl.
CPC ............ *F21K 9/232* (2016.08); *F21Y 2115/10* (2016.08); *H01L 2224/16225* (2013.01); *H01L 2224/48137* (2013.01); *H01L 2924/181* (2013.01); *Y10T 29/49826* (2015.01)

(56) References Cited

U.S. PATENT DOCUMENTS

| | | |
|---|---|---|
| 2010/0207511 A1 | 8/2010 | Harada |
| 2013/0049049 A1* | 2/2013 | Choi ................. H01L 33/486 257/98 |
| 2013/0170179 A1 | 7/2013 | Kadoma et al. |
| 2014/0098529 A1 | 4/2014 | Hata et al. |
| 2016/0013374 A1* | 1/2016 | Dijken ................. H01L 33/486 257/98 |
| 2017/0175958 A1 | 6/2017 | Kadoma et al. |

FOREIGN PATENT DOCUMENTS

| | | |
|---|---|---|
| JP | 2012-129135 | 7/2012 |
| JP | 2012-199104 | 10/2012 |
| JP | 2012-227470 | 11/2012 |
| WO | 2012/066881 | 5/2012 |
| WO | 2012/096326 | 7/2012 |
| WO | 2012/165007 | 12/2012 |

OTHER PUBLICATIONS

Japanese Notification of Reasons for Refusal dated Jul. 24, 2017 in corresponding Japanese Patent Application No. 2013-214043 with English translation.

* cited by examiner

LIGHTING DEVICE INCLUDING PHOSPHOR COVER AND METHOD OF MANUFACTURING THE SAME

CROSS-REFERENCE TO RELATED APPLICATION

This application is a new U.S. patent application that claims benefit of JP2013-214042, filed on Oct. 11, 2013 and JP2013-214043, filed on Oct. 11, 2013, the disclosures of which are incorporated herein by reference in its entirety.

BACKGROUND OF THE INVENTION

Field of the Invention

The present invention relates to a lighting device including a phosphor cover arranged to receive light from a light source, and also relates to a method of manufacturing a lighting device including a phosphor cover.

Description of the Related Art

There is some phosphor members suggested in patent application publications as follows. For example, it is open to the public that a light-emitting diode including a light-emitting element, a substrate to which the LED element is electrically connected, a resin having a diffusion-reflection covering surfaces of the light-emitting element other than an emission surface, and a translucent resin containing fluorescent material covering the emission surface (For reference, see U.S. Unexamined Patent Application Publication No. 2005/0219835 A1).

Also, it is open to the public that a lighting device including a light-emitting element and a wavelength-conversion part including two or more light-conversion layers stacked in a light-advancing direction (For reference, see Japanese Unexamined Patent Application Publication No. 2005-311136). This publication also discloses that the phosphor layer including the phosphor capable to convert light of the light-emitting element into a longer wavelength light is arranged closer to the light-emitting element than another phosphor layer including another phosphor.

It is laid open to the public that a semiconductor device includes a semiconductor light emitting device (LED) to emit light with a first wavelength peak, a first phosphor region to convert light from the LED into light with a second wavelength peak, and a second phosphor region to convert light from the LED into light with a third wavelength peak when electricity is applied to the LED (For reference, see U.S. Unexamined Patent Application Publication No. 2009/0039375 A1).

It is laid open to the public that a light emitting device includes a color conversion plate having a sea-island structure wherein the sea-island structure includes an island region with a first phosphor and a sea region with a second phosphor (For reference, see U.S. Unexamined Patent Application Publication No. 2010/0207511 A1).

It is laid open to the public that a lighting device including a light source, a bundle of phosphor pieces that are bundled together, and a light-shielding layer arranged between adjacent phosphor pieces of the bundle to cover peripheral side surfaces of the phosphor pieces (For reference, see Japanese Unexamined Patent Application Publication No. 2012-129135).

Also, it is laid open to public that a lighting device including LED chips arranged on a wiring substrate, a phosphor light-converting member including a plurality of light-converting regions that face the LED chips. For reference, see Japanese Unexamined Patent Application Publication (For reference, see Japanese Unexamined Patent Application Publication No. 2012-199104).

It is laid open to the public that a lighting device including an LED element with a sapphire substrate, a phosphor sheet adhered on an upper surface of the sapphire substrate of the LED element, and a white reflection member 17 covering a peripheral side surface of the LED element (For reference, see Japanese Unexamined Patent Application Publication No. 2012-227470).

SUMMARY OF THE INVENTION

In a first aspect of the present inventive subject matter, a phosphor cover includes a phosphor layer with a spiral surface.

It is also suggested that a phosphor cover includes a phosphor layer and a light-reflection layer that is arranged on the phosphor layer, and the light-reflection layer and the phosphor layer are spiraled around each other.

Furthermore, it is suggested that a phosphor cover includes two or more phosphor layers. It is disclosed that a phosphor cover includes a first phosphor layer and a second phosphor layer that are layered, and the phosphor cover includes a spiral surface of the first phosphor layer and the second phosphor layer.

It is suggested that the spiral surface of the phosphor cover is a circle spiral surface.

Also, it is suggested that the spiral surface of the phosphor cover is a square spiral surface.

In a second aspect of the present inventive subject matter, a lighting device includes a light source including a light-emitting surface, and includes a phosphor cover that includes a spiral surface that covers the light-emitting surface of the light source.

In a third aspect of the present inventive subject matter, a method manufacturing a lighting device includes: rolling up a phosphor film from one end to another end to form a roll with spiral surfaces both ends of the roll of the phosphor film.

It is also suggested that the method may further include: arranging the roll as a phosphor cover above a light source.

It is also suggested that the method may further include: dividing the roll in a direction parallel with the spiral surfaces into phosphor covers.

Furthermore, it is suggested that a method includes: providing a first film; placing a second film on the first film to be layered; and rolling up the layered first and second films to form a roll with spiral surfaces.

It is also suggested that the method further includes: arranging the roll as a phosphor cover above a light source.

In an another aspect of the present inventive subject matter, a method manufacturing a lighting device includes: alternately stacking and adhering layers of a first film that includes a first phosphor and layers of a second film that includes a second phosphor different from the first phosphor such that a peripheral side surface of the phosphor cover is striped by the first film and the second film.

BRIEF DESCRIPTION OF THE DRAWINGS

FIG. 7B shows an upper side of the light source, and FIG. 7C shows a lower side of the light source.

FIG. 13A' shows a phosphor film that is larger than a phosphor cover for example shown in FIG. 13B if the phosphor cover is unrolled from its spiral form.

FIG. 13B'-1 shows the phosphor film that is rolled up from one end of the phosphor film to the other end of the phosphor film to form a roll of the phosphor film.

FIG. 13B'-2 shows dividing the roll of the phosphor film into one or more phosphor covers.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "contains", "containing", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "lower" or "upward" or "downward" or "left" or "right" or "front" or "rear" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar and/or corresponding and/or related structures throughout. It should be noted that the drawings are schematic in nature.

Figure 1A:
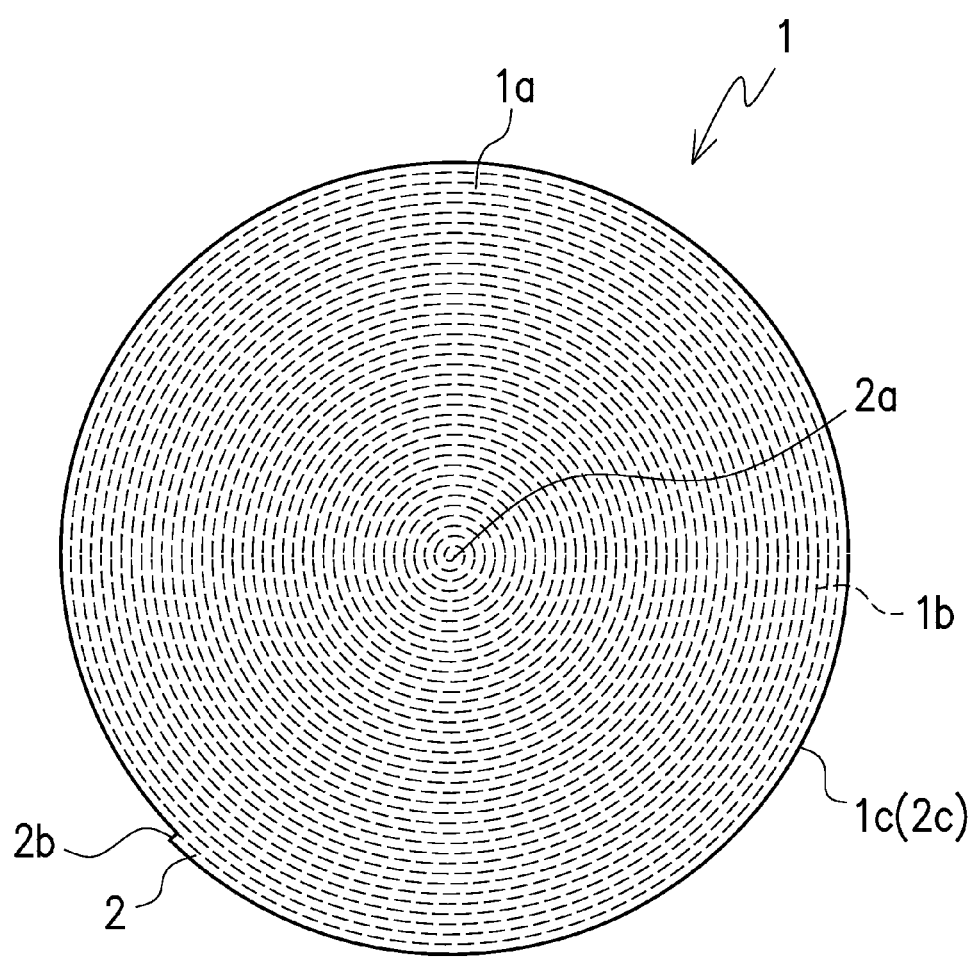
FIG. 1A is a schematic top plan view of phosphor cover including a phosphor layer that is spiral, according to a first embodiment of phosphor cover of the present invention.

FIGS. 1A to 1F show embodiments of phosphor cover according to the present invention. FIG. 1A is a schematic top plan view of phosphor cover including a circular spiral surface according to a first embodiment of phosphor cover of the present invention.

A phosphor cover 1 includes spiral surfaces 1a, 1b opposite to each other and a peripheral side surface 1c. In the phosphor cover 1, a first end 2a (starting end) of phosphor layer 2 that includes a phosphor is positioned adjacent to a center of the spiral surfaces 1a, 1b and a second end 2b (finishing end) of the phosphor layer is positioned on the peripheral side surface 1c of the phosphor cover 1. The word of "phosphor layer" here includes a phosphor strip and a phosphor film. In this embodiment, the outer peripheral side surface 1c of the phosphor cover 1 is a part of an outer peripheral surface 2c of the phosphor layer 2.

Figure 2A:
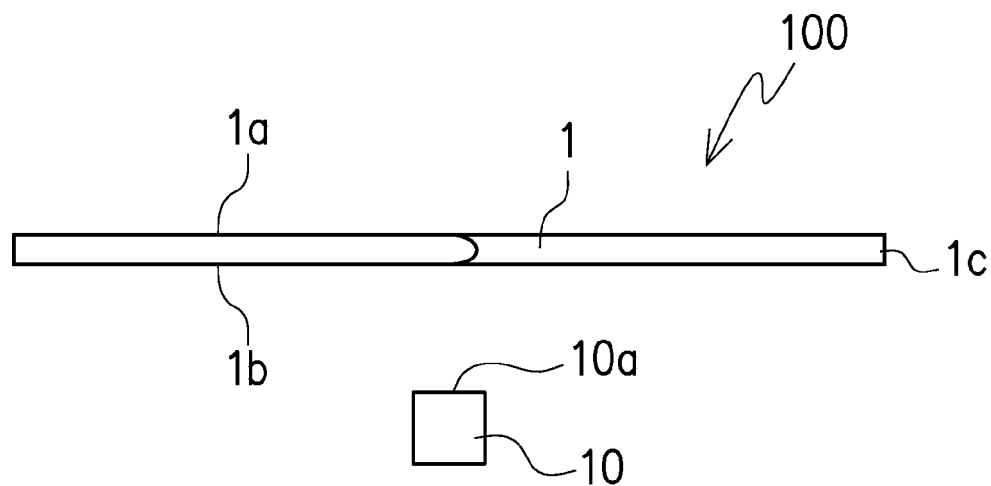
FIG. 2A is a schematic side view of a lighting device including a phosphor cover and a light source with a light-emitting surface spaced away from a spiral surface 1b of the phosphor cover 1.
Figure 2B:
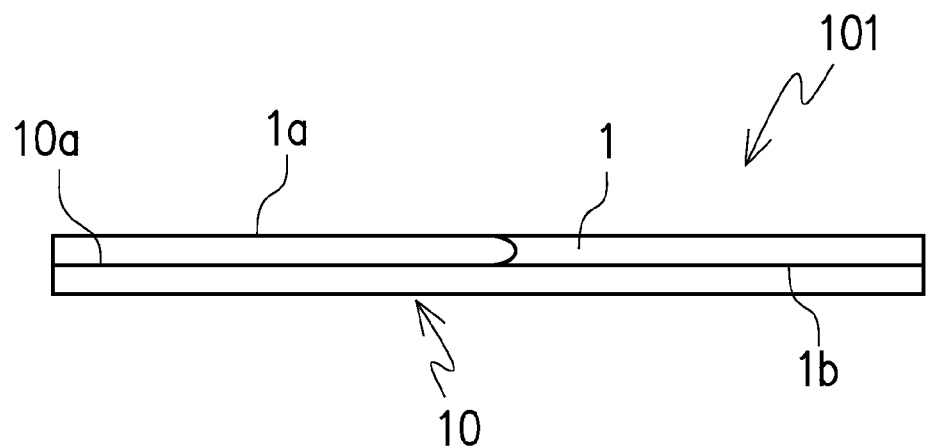
FIG. 2B is a schematic side view of a lighting device including a phosphor cover and a light source with a light-emitting surface arranged directly in contact with a spiral surface of the phosphor cover.

The spiral surfaces 1a, 1b of the phosphor cover 1 are circular surfaces. The phosphor cover 1 may appear to have a constant thickness when viewed from a peripheral side surface 1c of the phosphor cover as shown in FIG. 2A and FIG. 2B, for example.

Also, light with peak emission spectrum range 490 nm-560 nm may appear to be green light, light with peak emission spectrum range 400 nm-490 nm may appear to be blue light, and light with emission spectrum peak range 350 nm-400 nm may appear to be near ultraviolet light. Light with peak emission spectrum range 10 nm-350 nm may be categorized as ultraviolet light.

A light-emitting element included in the light source is configured to emit light with peak emission spectrum in a range of 350 nm to 500 nm.

The phosphor included in the phosphor cover 1 is selectable from phosphors that are excitable in response to light from a light source.

The light-emitting element 12 may be ultraviolet light-emitting diode element. For example, if the light source 10 is a light-emitting element with emission spectrum peak range from 380 nm to 400 nm, a phosphor or a combination of two or more phosphors including red phosphor, yellow phosphor, green phosphor and blue phosphor are selectable. As a red phosphor, $CaAlSiN_3$:Eu, (Ca, Sr)$AlSiN_3$:Eu, $CaSi_5N_8$:Eu, $KSiF_6$:Mn and/or $KTiF_6$:Mn can be selectable, just as an example. Also, as a yellow phosphor, (Sr, Ba)$_2SiO_4$:Eu, $Ca_x(Si, Al)_{12}(O, N)_{16}$:Eu can be selectable, just as an example. As a green phosphor, (Ba, Sr)$_2SiO_2$:Eu, $Ba_3Si_6O_{12}N_2$:Eu, (Si, Al)$_6$(O, N)$_8$:EU, $BaMgAl_{10}O_{17}$:Eu can be selectable, just as an example. As a blue phosphor, $BaMgAl_{10}O_{17}$:Eu, just as an example.

The phosphor layer 2 of the phosphor cover may have an elongated shape if the phosphor cover is unrolled. The phosphor layer may have a shape of thread, strip, ribbon, square film, or rectangular film, for example.

The light-emitting element 12 may be blue light-emitting diode element. Also, if the light source 10 may be one or more light-emitting elements with peak emission spectrum in the range of 440 nm-460 nm, a phosphor included in the phosphor cover 1 is selectable among various phosphors that are excitable by light from a light source with peak emission spectrum in the range of 440 nm-460 nm. For example, such various phosphors include red phosphor, yellow phosphor, green phosphor. As a red phosphor, (Ca, Sr)$AlSiN_3$:Eu, $CA_2Si_5N_8$:Eu, $AlSiN_3$:Eu, $CaSi_5N_8$:Eu, $KSiF_6$:Mn and/or $KTiF_6$:Mn can be selectable, just as an example. Also, as a yellow phosphor, $Y_3Al_5O_{12}$:Ce (Usually called as "YAG"), (Sr, Ba)$_2SiO_4$:Eu, $Ca_x(Si, Al)_{12}(O, N)_{16}$:Eu can be selectable, just as an example. As a green phosphor, (Lu, Y)$_3Al_5O_{12}$:Ce, $Y_3$(Ga, Al)$_5O_{12}$:Ce, $Ca_3Sc_2Si_3O_{12}$:Ce, $CaSc_2O_4$:Eu, (Ba, Sr)$_2SiO_2$:Eu, $Ba_3Si_6O_{12}N_2$:Eu, (Si, Al)$_6$(O, N)$_8$:Eu, can be selectable, just as an example.

The phosphor cover 1 may include two or more phosphor layers. If a phosphor cover 1 with a spiral surface that includes a first phosphor layer containing a red phosphor and a second phosphor layer containing a green phosphor is arranged above a light source with peak emission spectrum in the range of 400 nm-490 nm, light with a better color rendering property can be achieved than a phosphor cover of a single layer of phosphor arranged with the light source of the same peak emission spectrum in the range of 400 nm-490 nm.

Figure 1B:
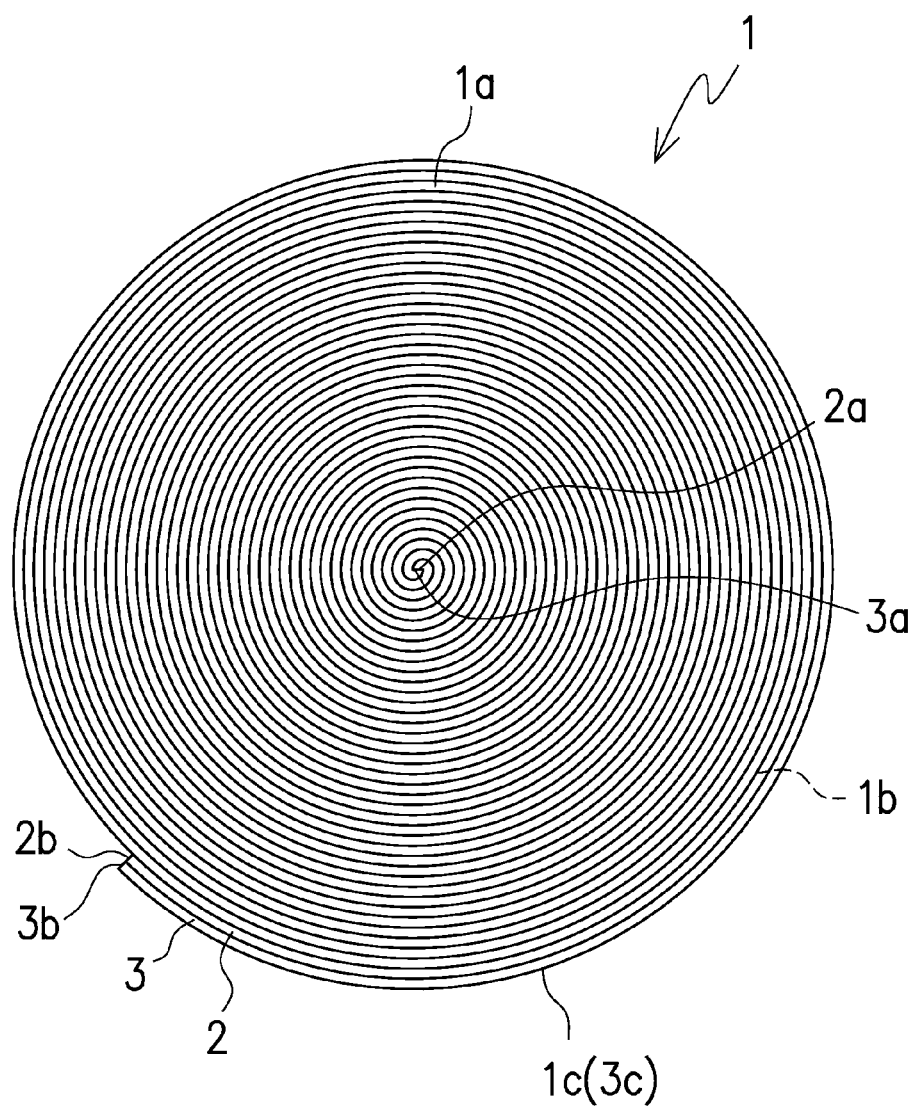
FIG. 1B is a schematic top plan view of phosphor cover including a phosphor layer and a light-reflection layer that is arranged on a surface of the phosphor layer, and the phosphor layer and the light reflection layer of the phosphor cover are spiral together.

FIG. 1B is a schematic top plan view of phosphor cover 1 including a phosphor layer 2 and a light-reflection layer 3 that is arranged on a surface of the phosphor layer 2. The light-reflection layer 3 that is a metal evaporated layer on the surface of the phosphor layer 2. The phosphor layer 2, on which the light-reflection layer 3 is vapored, is rolled up.

The light-reflection layer 3 and the phosphor layer 2 are spiral around each other to constitute the phosphor cover 1 in this embodiment. The phosphor cover 1 in this embodiment includes circle spiral surfaces 1a, 1b that are opposite to each other.

In FIG. 1B, the outer peripheral side surface 1c of the phosphor cover 1 is a part of an outer peripheral surface 3c of the light-reflection layer 3. In this embodiment, a first end 2a (starting end) of the phosphor layer 2 and a first end 3a (starting end) of the light-reflection layer 3 are positioned adjacent to a center of the opposite circle spiral surfaces 1a, 1b of the phosphor cover 1. A second end 2b (finishing end) of the phosphor layer 2 and a second end 3b (finishing end) of the light-reflection layer 3 are positioned on the outer peripheral side surface 1c of the phosphor cover 1. The light-reflection layer 3 that is made of metal reflects light inward in radial direction of the phosphor cover 1, and the light is recycled for upward light toward above the first spiral surface 1a. The light-reflection layer 3 is layered on an outer surface of the phosphor layer 2 in the phosphor cover 1. At the spiral surface 1b of the phosphor cover 1, because the phosphor layer 2 and the light-reflection layer 3 are spiraled together, it is possible to make directivity of light through the region the phosphor layer 2 that is surrounded by the region of the light-reflection layer 3 narrow when light emitted from the light source passes through the phosphor cover 1. Also, it is possible to suppress influence of another phosphor contained in an adjacent round of the phosphor layer 2 on light already converted by a phosphor by the existence of the alternately arranged round of the light-reflection layer 3.

A phosphor cover 1 may include two or more phosphor layers. The two or more phosphor layers are integrated to be a film of layers. The two or more phosphor layers of the phosphor cover 1 may include different phosphors to be excited by light from a light source arranged to face the phosphor cover 1 and to convert light from the light source into light with different and/or shifted peak emission spectrum range.

Figure 1C:
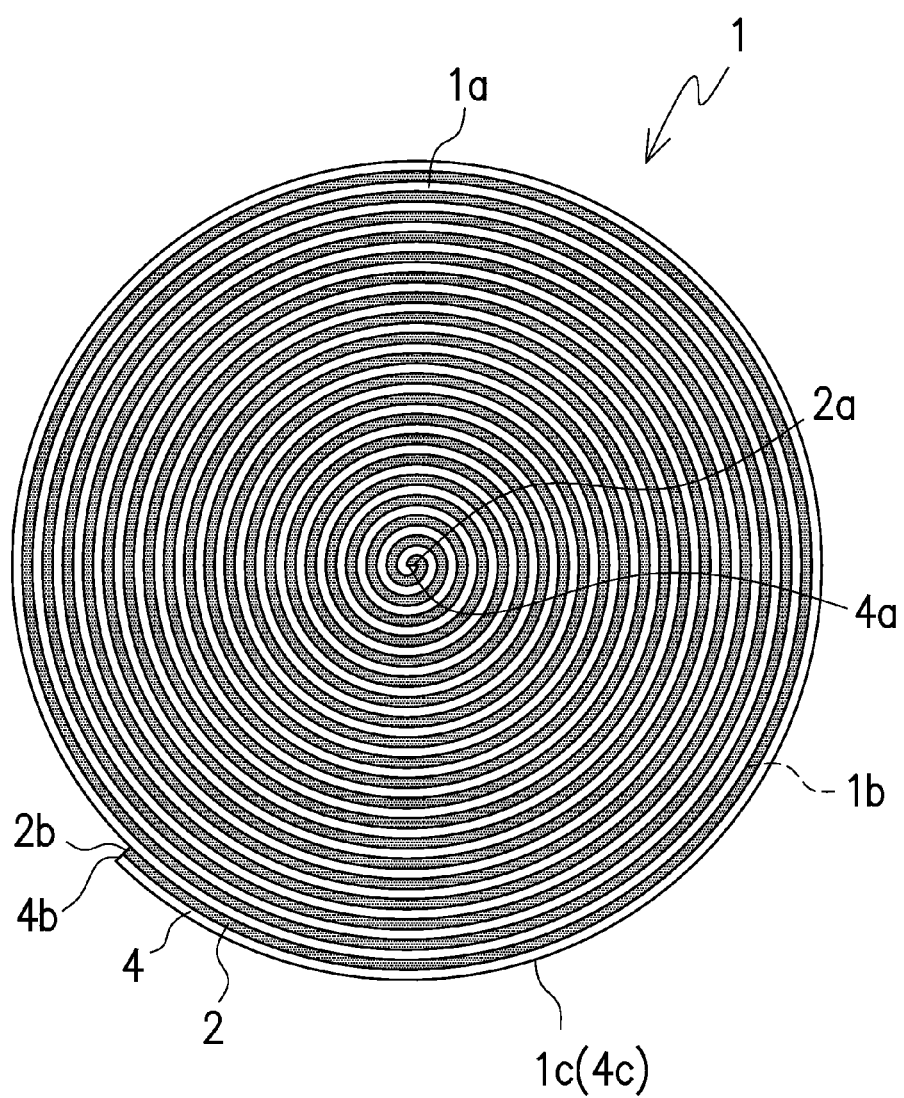
FIG. 1C is a schematic top plan view of a third embodiment of phosphor cover including a first phosphor layer and a second phosphor layer that are layered and spiral together.

FIG. 1C is a schematic top plan view of a third embodiment of phosphor cover 1 including a first phosphor layer 2 and a second phosphor layer 4 that is layered on a surface of the first phosphor layer 2. The phosphor cover 1 in this embodiment includes circle spiral surfaces 1a, 1b that are opposite to each other. In this embodiment, a first end 2a (starting end) of the phosphor layer 2 and a first end 4a (starting end) of the second phosphor layer 4 are positioned adjacent to a center of the circle spiral surfaces 1a, 1b of the phosphor cover 1. A second end 2b (finishing end) of the phosphor layer 2 and a second end 4b (finishing end) of the second phosphor layer 4 are positioned on the outer peripheral side surface 1c of the phosphor cover 1. In FIG. 1C, the outer peripheral side surface 1c of the phosphor cover 1 is a part of an outer peripheral surface 4c of the second phosphor 4. The phosphor cover 1 of this embodiment may further include a light-reflection layer 3 arranged on the outer peripheral side surface 1c of the phosphor cover 1.

Figure 1D:
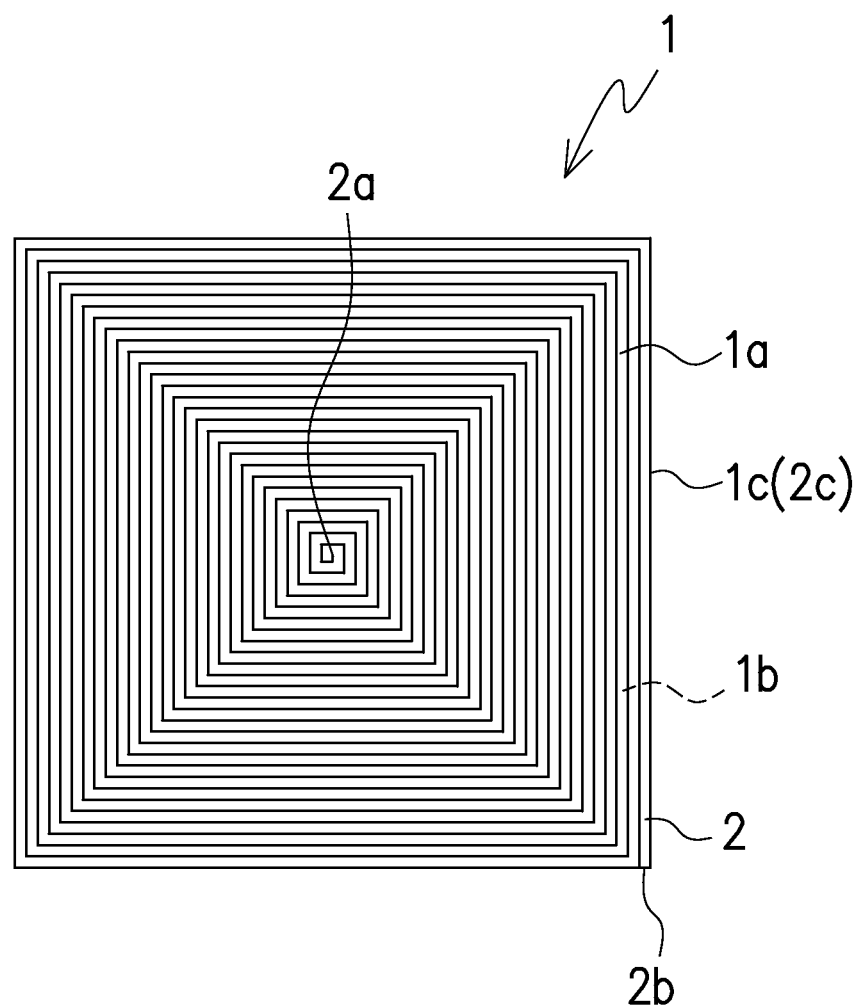
FIG. 1D is a schematic top plan view of a fourth embodiment of phosphor cover including a phosphor layer that is spiral.

FIG. 1D is a schematic top plan view of a fourth embodiment of phosphor cover 1 including a phosphor layer 2 that is spiral. The phosphor cover 1 in this embodiment includes square spiral surfaces 1a, 1b that are opposite to each other. Though the shape of the spiral surfaces 1a, 1b of the phosphor cover 1 shown in FIG. 1A is circular and different from the phosphor cover 1 that is square in FIG. 1D, other explanations of the phosphor cover 1 of FIG. 1A can be referenced as explanations for the phosphor cover 1 of FIG. 1D.

Figure 1E:
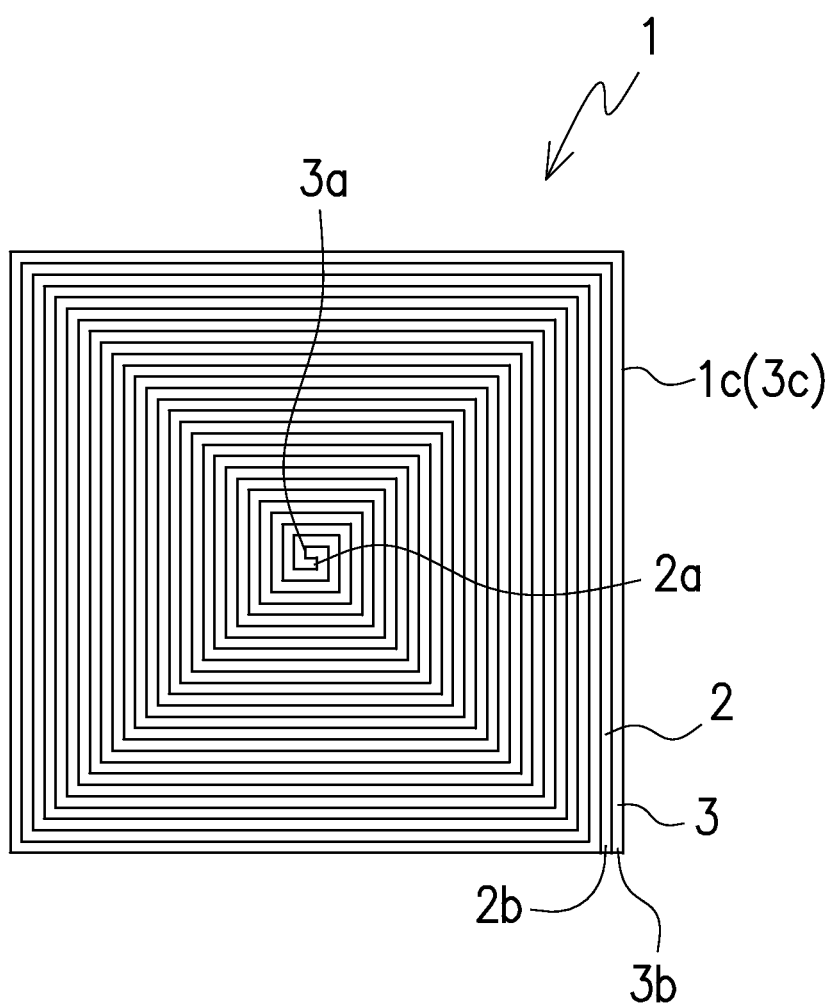
FIG. 1E is a schematic top plan view of a fifth embodiment of phosphor cover including a phosphor layer and a light-reflection layer that is arranged on a surface of the phosphor layer.

FIG. 1E is a schematic top plan view of a fifth embodiment of phosphor cover 1 including a phosphor layer 2 and a light-reflection layer 3 that is arranged on the phosphor layer 2. The phosphor layer 2 with the light-reflection layer 3 that is vapored on a surface of the phosphor layer 2 is rolled up together. The light-reflection layer 3 and the phosphor layer 2 are spiral around each other. The phosphor cover in this embodiment includes square spiral surfaces 1a, 1b that are opposite to each other. Though the shape of the spiral surfaces 1a, 1b of the phosphor cover 1 shown in FIG. 1B is circular and different from the phosphor cover 1 that is square in FIG. 1E, other explanations of the phosphor cover 1 of FIG. 1B can be referenced as explanations for the phosphor cover 1 of FIG. 1E.

Figure 1F:
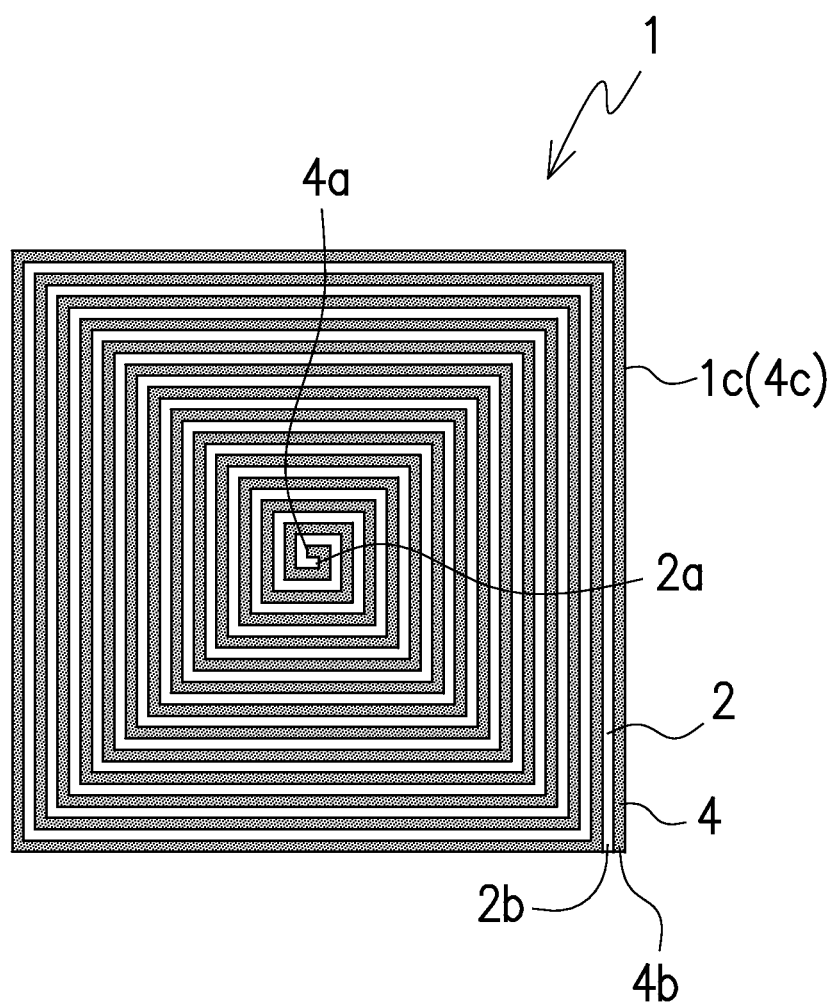
FIG. 1F is a schematic top plan view of a sixth embodiment of phosphor cover includes a first phosphor layer and a second phosphor layer that is layered on a surface of the first phosphor layer. The phosphor cover includes square spiral surfaces opposite to each other.

FIG. 1F is a schematic top plan view of a sixth embodiment of phosphor cover 1 includes square spiral surfaces opposite to each other. The phosphor cover 1 in this embodiment includes a first phosphor layer 2 and a second phosphor layer 4 that is layered on a surface of the first phosphor layer 2. Though the shape of the spiral surfaces 1a, 1b of the phosphor cover 1 shown in FIG. 1C is circular and different from the phosphor cover 1 that is square in FIG. 1F, other explanations of the phosphor cover 1 of FIG. 1C can be referenced as explanations for the phosphor cover 1 of FIG. 1F.

FIG. 2A is a schematic side view of a lighting device 100 including a phosphor cover 1 and a light source 10 with a light-emitting surface 10a spaced away from a spiral surface of the phosphor cover 1. For more details, the phosphor cover 1 includes a first spiral surface 1a and a second spiral surface 1b that are opposite to each other. The first spiral surface 1a may be a light-exit surface and the second spiral surface 1b may be arranged to face the light-emitting surface 10a of the light source 10. At least a part of light from the light source 10 passing through the phosphor cover 1 is configured to be converted by a phosphor included in the phosphor cover 1. Light from the light source 10 and/or light converted by the phosphor included in the phosphor cover 1 are configured to be exited through the first spiral surface 1a.

The light-emitting surface 10a of the light source 10 may be spaced away from the spiral surface 1b by air. Also, the light-emitting surface 10a of the light source 10 may be spaced away from the spiral surface 1b by light-transmitting resin. The light-transmitting resin may be a transparent resin and/or translucent resin.

FIG. 2B is a schematic side view of a lighting device 101 including a phosphor cover 1 and a light source 10 with a light-emitting surface 10a arranged directly in contact with the second spiral surface 1b of the phosphor cover 1.

A light source may include two or more light-emitting elements arranged in a region of circle, semi-circle, quarter-circle, double circle, square, rectangle and/or a combination thereof. Also a light source may be a single light-emitting diode chip.

Figure 3:
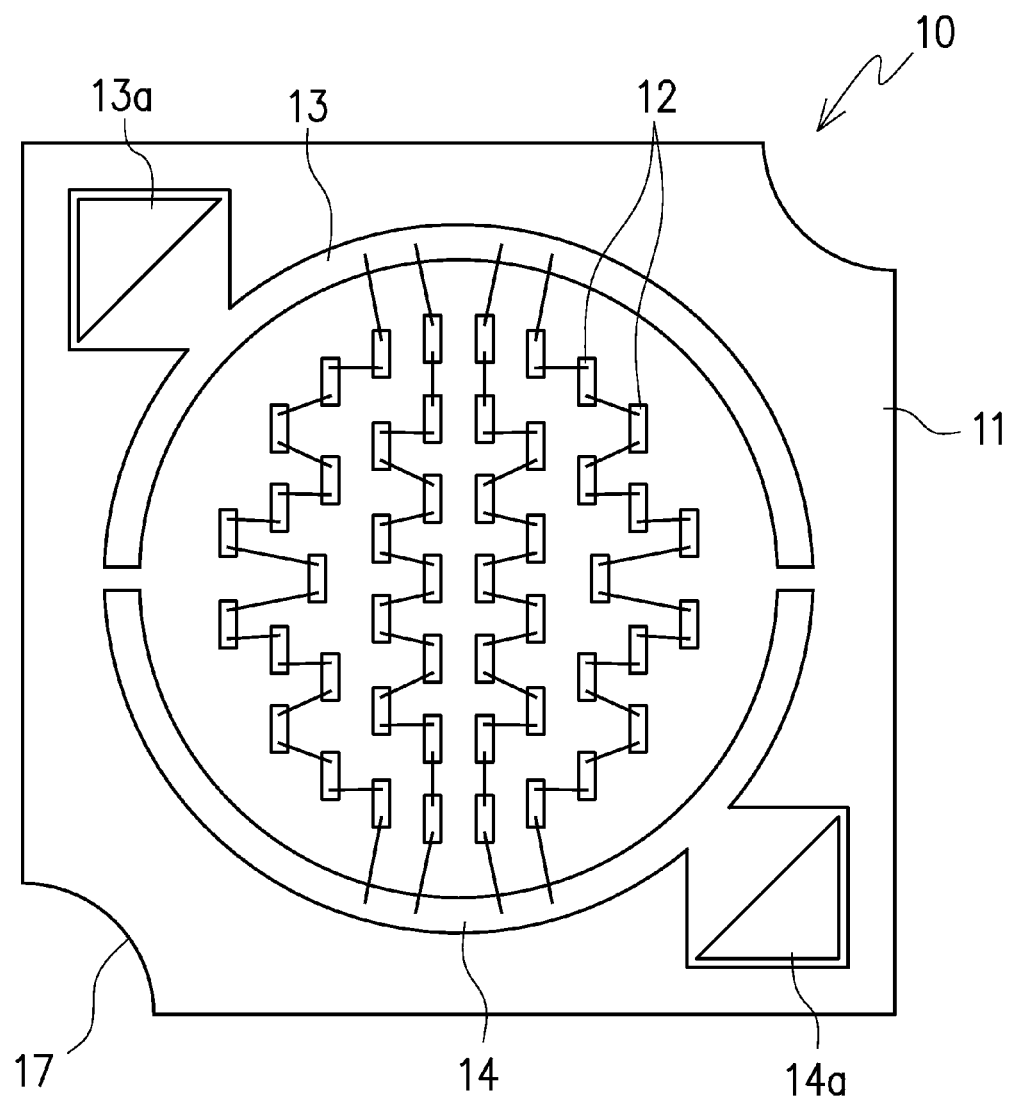
FIG. 3 is an example of a light source that can be arranged to face a spiral surface of the phosphor cover.

FIG. 3 is an example of a light source 10 that can be arranged to face a spiral surface of the phosphor cover 1. The light source 10 in this example includes a plurality of light-emitting elements 12 that are arranged in a circular region and are electrically connected to a first electrode 13 and a second electrode 14 arranged on a substrate 11. The substrate 11 may include a cut portion 17 or a hole at which the light source 10 is fasten to a support (not shown) by a screw (not shown), for example. The support may be another substrate, a holder, and so on.

The first terminal electrode 13a is electrically connected to the first electrode 13 and a second terminal electrode 14a is electrically connected to the second electrode 14. The first electrode 13 is arranged partly along the circular region. The second electrode 14 is arranged partly along the circular region. The light-emitting elements 12 may include two or more groups each of which include a number of light-emitting elements 12 that are electrically connected in series. The number of the light-emitting elements 12 in each group and/or the number of the groups are selectable according to a size, shape of the region in which the light-emitting elements 12 are arranged, for example.

Figure 4:
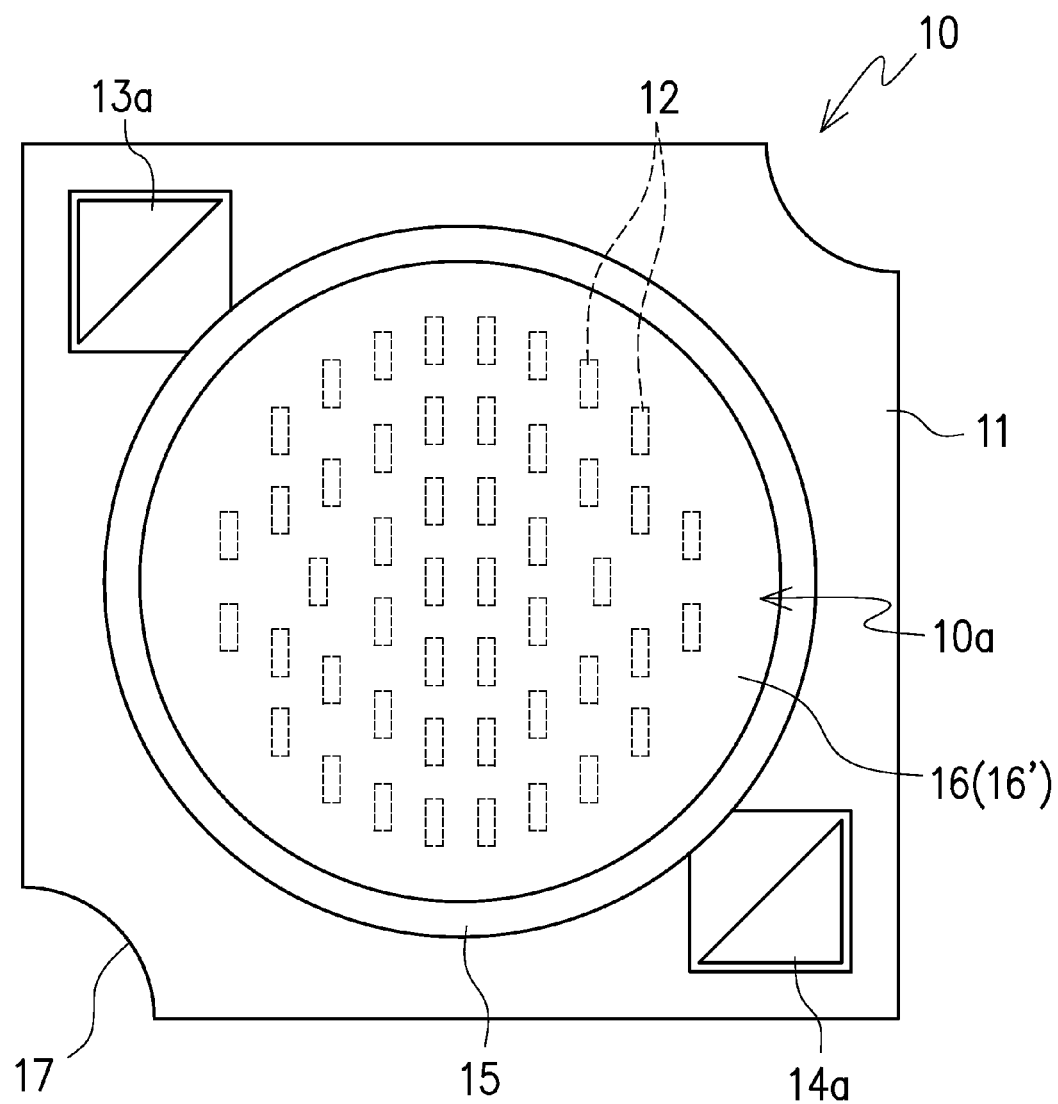
FIG. 4 shows a condition that light-emitting elements of the light source shown in FIG. 3 are sealed by light-transmitting resin. In another example, a light-reflection resin may be arranged instead of the light-transmitting resin.

FIG. 4 shows a light source 10 in a condition that light-emitting elements 12 of the light source 10 shown in FIG. 3 are entirely sealed by light-transmitting resin 16. The light-transmitting resin 16 may be transparent resin. Also, the light-transmitting resin 16 may be translucent resin including light-diffusing particles and/or a phosphor. The light-transmitting resin 16 is retained by a retention member 15 that retains the light-transmitting resin 16. The retention member 15 may include a light-reflecting particle. The retention member 15 may be made of white-colored resin. For example, the retention member 15 may be made of silicone resin including titanium oxide ($TiO_2$) particle. The retention member 15 may appear to be opaque.

Also, it is possible that the retention member 15 is partly made of a transparent resin. The retention member 15 may be circular-ring shaped. The retention member 15 may have a shape of square-ring shaped, half-circular ring shaped, a quarter-circular ring shaped, and/or a combination thereof.

Figure 5:
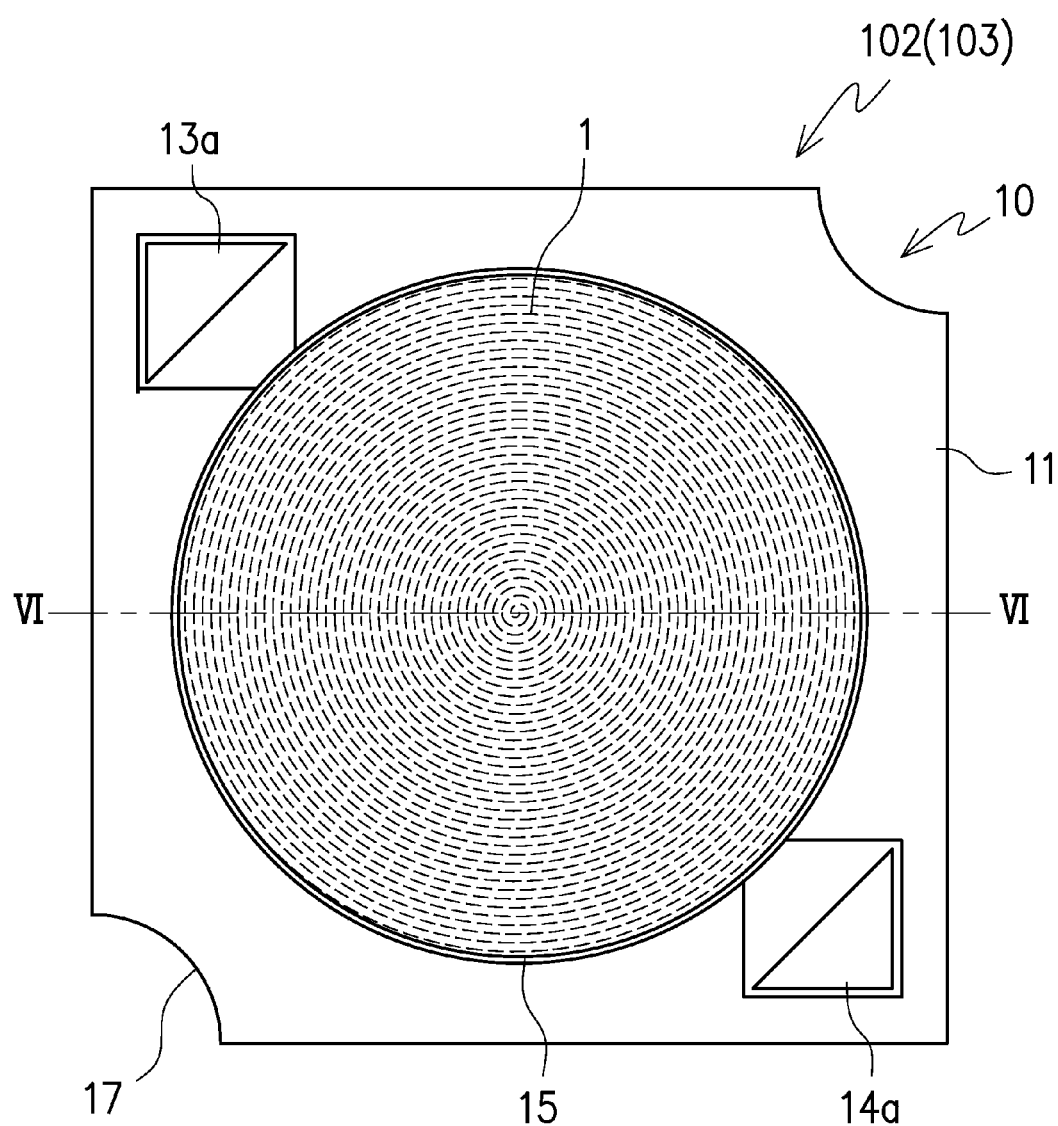
FIG. 5 shows a lighting device including a phosphor cover arranged above a light source.

FIG. 5 shows a lighting device 102(103) including a phosphor cover 1 with a circle spiral surface of the phosphor cover 1.

Figure 6A:
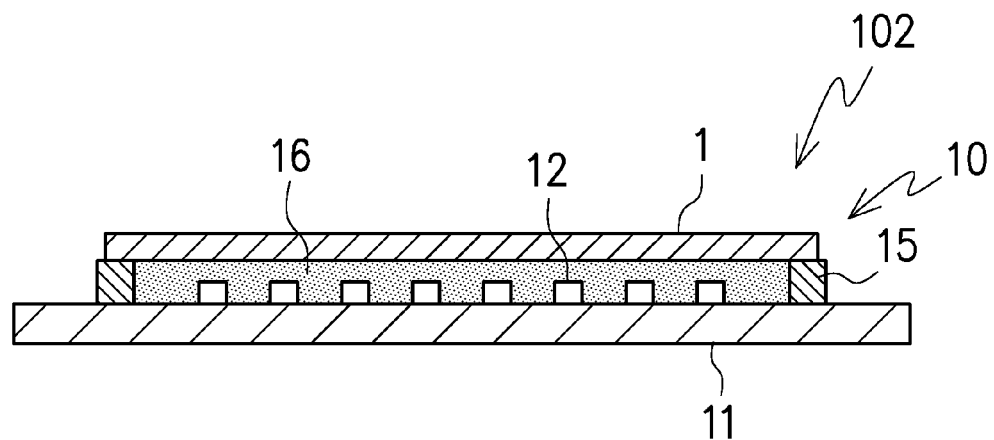
FIG. 6A is a cross-sectional view of the lighting device taken along a line VI-VI shown in FIG. 5.

FIG. 6A is a cross-sectional view of the lighting device 102 taken along a line VI-VI shown in FIG. 5. In this embodiment, the light-emitting elements 12 are entirely sealed by the light-transmitting resin 16, and the phosphor cover 1 is arranged in contact with an upper surface of the light-transmitting resin 16.

Figure 6B:
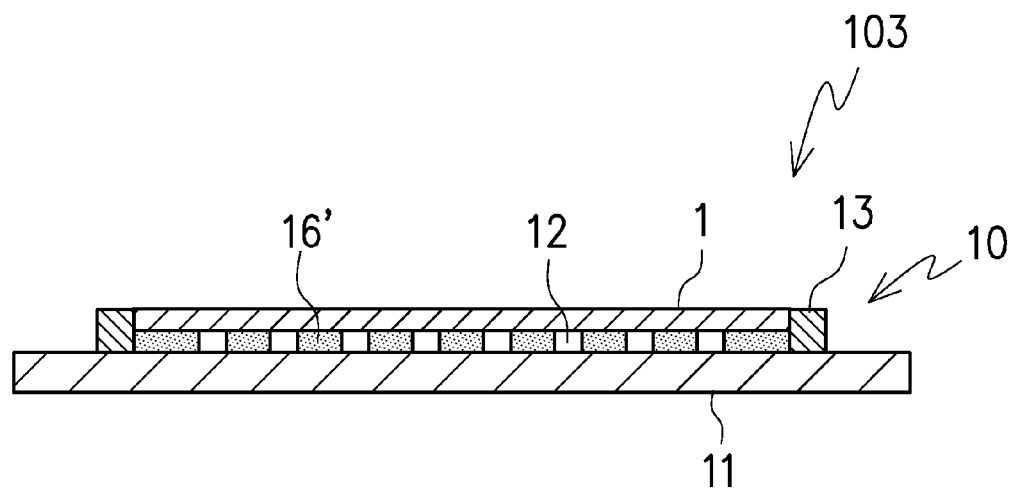
FIG. 6B is a cross-sectional view of the lighting device 103 take along a line VI-VI shown in FIG. 5.

FIG. 6B is a cross-sectional view of the lighting device 103 taken along a line VI-VI shown in FIG. 5. In this embodiment, a light-reflection resin 16' may be arranged instead of the light-transmitting resin 16 as the lighting device 103 shown in FIG. 5. In this embodiment, the light-reflection resin 16' is arranged to seal a peripheral side surface and/or a lower surface of the light-emitting element 12 of the light-emitting element 12. In this case, an upper surface of the light-emitting element 12 is free from the light-reflection resin 16'. The phosphor cover 1 is directly arranged on an upper surface of the light-emitting element 12.

Figure 7A:
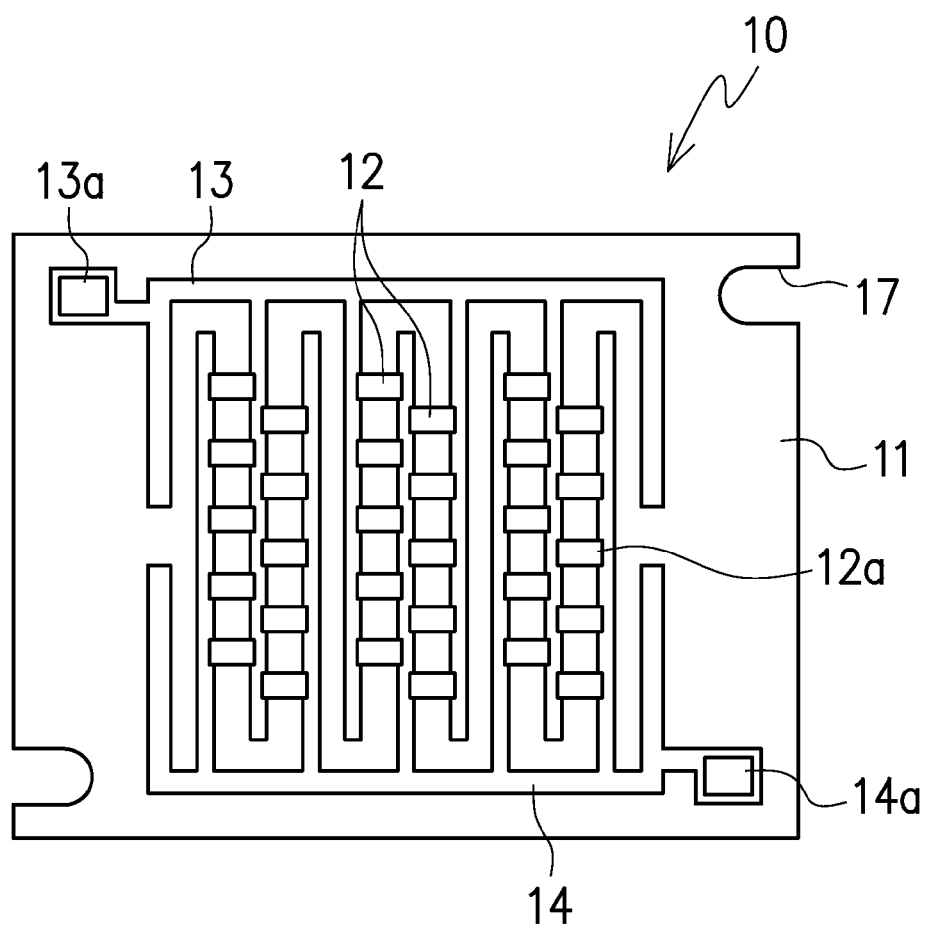
FIG. 7A shows an example of a light source that can be arranged to face a spiral surface of the phosphor cover.

FIG. 7A is an example of a light source 10 that can be arranged to face a spiral surface 1b of the phosphor cover 1. A light-emitting element 12 in this embodiment may include a first element electrode and a second element electrode on a lower surface of the light-emitting element 12. The light-emitting elements 12 are electrically mounted on a first electrode 13 and a second electrode 14 through a soldering, and/or a bump.

Figure 7B:
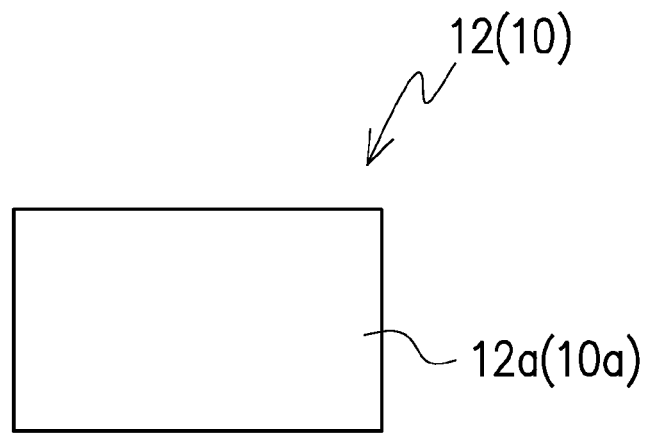
FIG. 7B and FIG. 7C show an example of a light source.
Figure 7C:
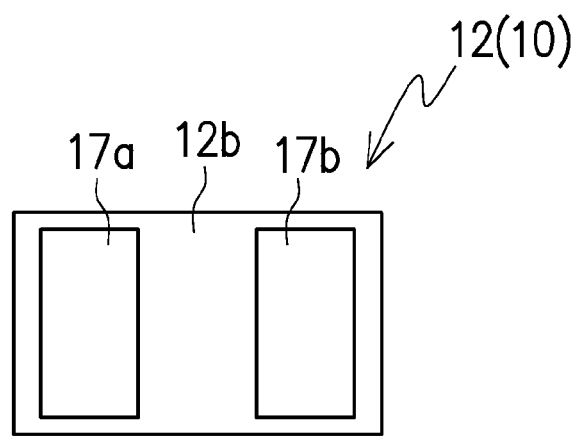

FIG. 7B and FIG. 7C show an example of a light source 10. A single light-emitting element 12 is applicable as a light source 10. FIG. 7B shows an upper side of the light source 10. FIG. 7C shows a lower surface 12b of the light source 10. The light-emitting element 12 includes a first element electrode 17a and a second element electrode 17b on the lower surface 12b of the light source 10.

A light source can be selectable among various light sources. The phosphor cover 1 including a square or rectangular spiral surface 1b may be arranged to face a square or rectangular light-emitting surface of the light source 10.

Figure 8:
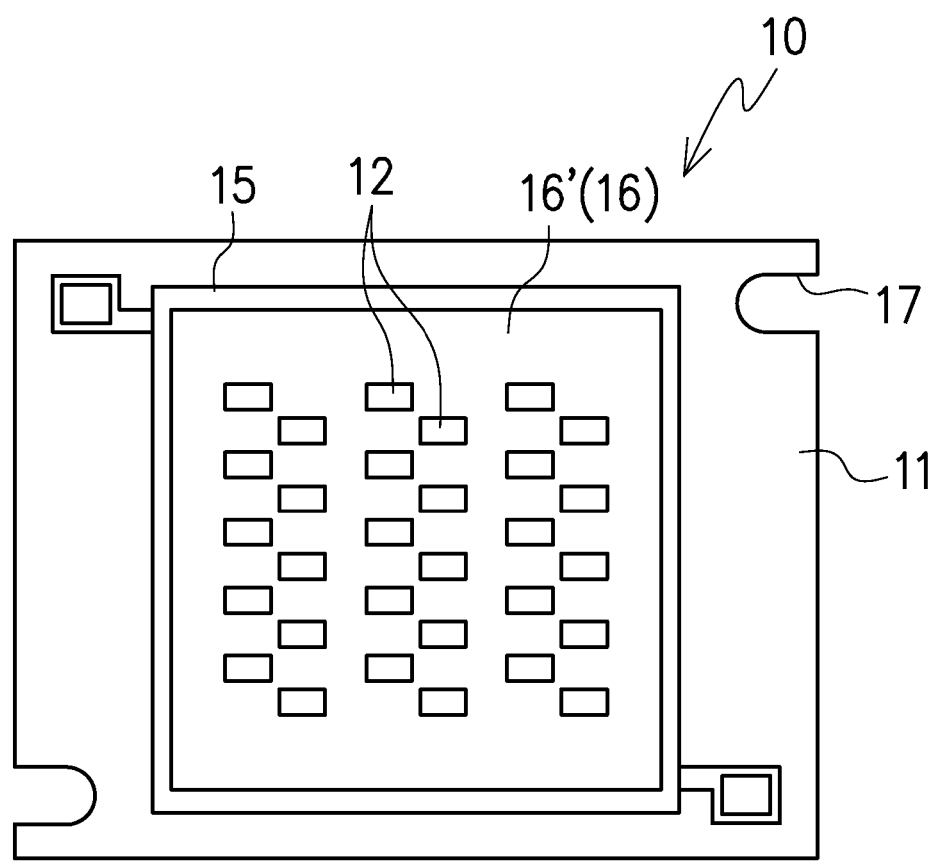
FIG. 8 shows a condition that light-emitting elements of the light source shown in FIG. 7A are partly sealed by a light-reflection resin or are entirely sealed by light-transmitting resin.

FIG. 8 shows a condition of a light source 10 in which a peripheral side surface and/or a lower surface of the light-emitting element 12 are sealed by a light-reflection resin 16'. Also, FIG. 8 shows a condition of a light source 10 in which a light-transmitting resin 16 is arranged instead of the light-reflection resin 16', and the light-transmitting resin 16 entirely seals the light-emitting element 12 including an upper surface, a peripheral side surface, and/or a lower surface of the light-transmitting element 12.

Figure 9:
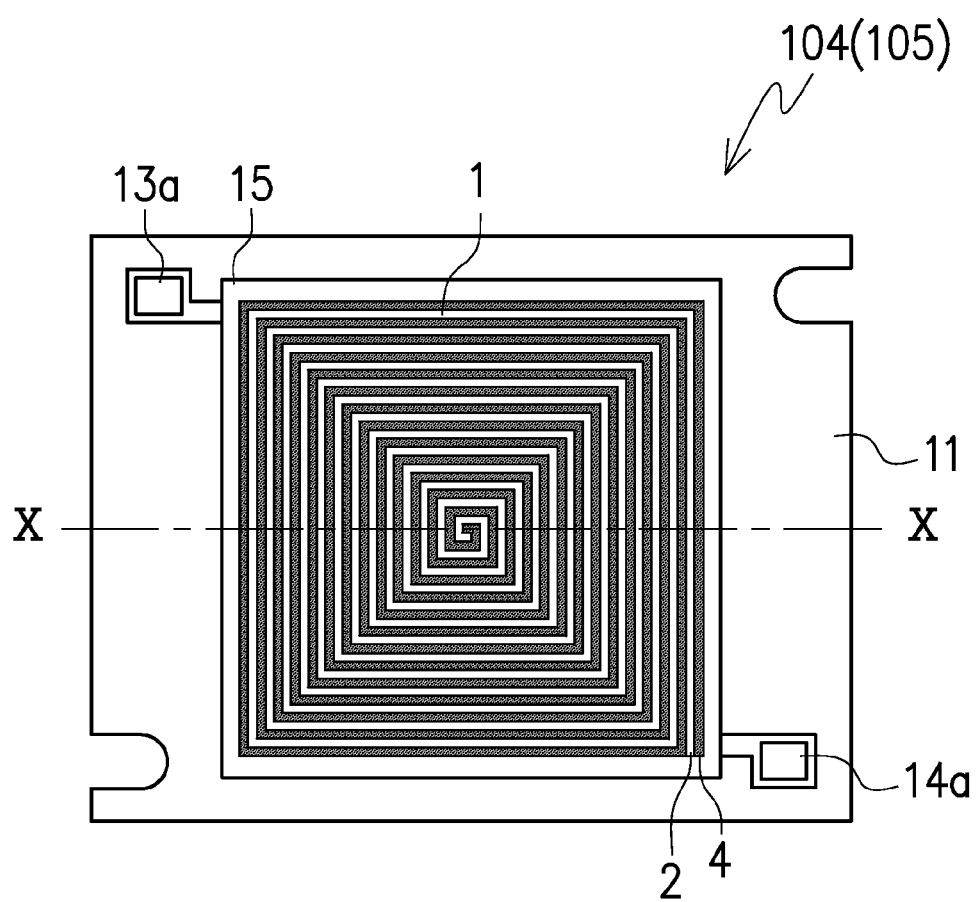
FIG. 9 shows a lighting device including a phosphor cover with a spiral surface that faces light-emitting surfaces of the light-emitting elements.

FIG. 9 shows a lighting device 104(105) including a phosphor cover 1 with a spiral surface 1b that faces light-emitting surfaces 10a of the light-emitting elements 12 in the light source 10.

In this embodiment, the phosphor cover 1 may include square spiral surfaces opposite to each other. The phosphor cover 1 in this embodiment may include a first phosphor layer 2 and a second phosphor layer 4, which is layered on a surface of the first phosphor layer 2 as shown in FIG. 1F. The phosphor cover 1 in this embodiment may be a phosphor cover 1 shown in FIG. 1D or a phosphor cover 1 shown in FIG. 1E, instead of the phosphor cover 1 shown in FIG. 1E, for example.

Figure 10A:
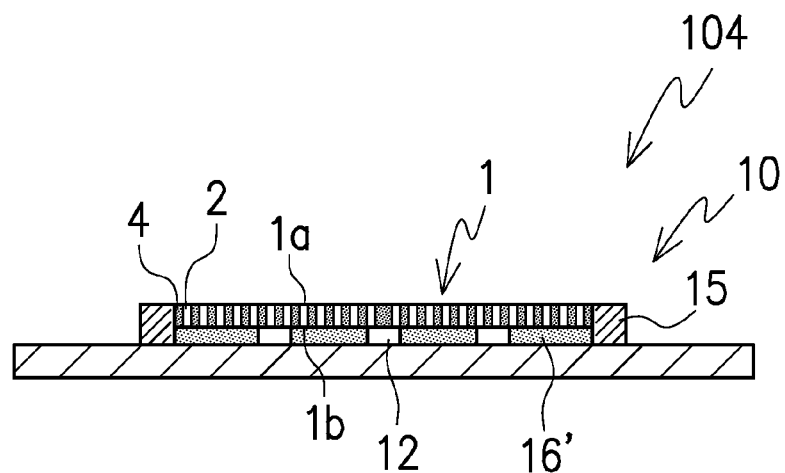
FIG. 10A shows a cross-sectional view of the lighting device that includes a retention member in which light-emitting elements are arranged and a light-reflection resin is filled to seal at least peripheral side surfaces of the light-emitting elements and further that includes a phosphor cover with a spiral surface that is in contact with light-emitting surfaces of the light-emitting elements.

FIG. 10A shows a cross-sectional view of the lighting device 104 taken along a line X-X shown in FIG. 9. The lighting device 104 includes a retention member 15 in which light-emitting elements 12 are arranged and a light-reflection resin 16' is filled to seal at least peripheral side surfaces of the light-emitting elements 12. The lighting device 104 further includes a phosphor cover 1 with a spiral surface 1b that is arranged in contact with light-emitting surfaces 10a of the light-emitting elements 12.

Figure 10B:
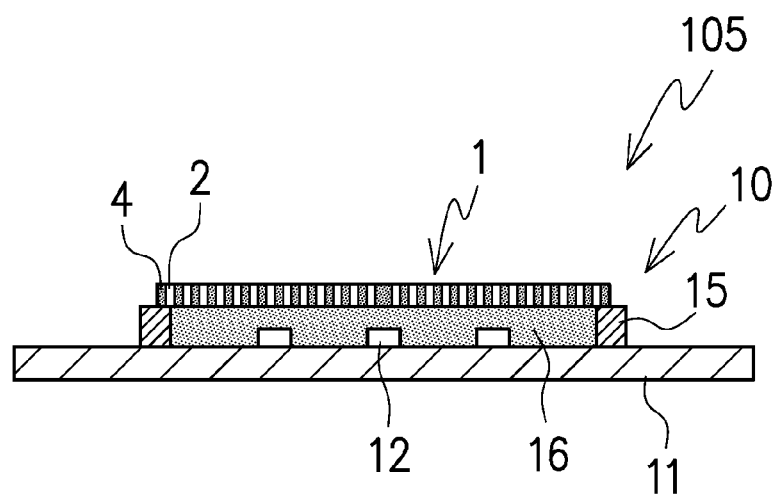
FIG. 10B shows a cross-sectional view of the lighting device that includes a retention member in which light-emitting elements are arranged and a light-transmitting resin (transparent) is filled to seal the light-emitting elements and further that includes a phosphor cover with a spiral surface that is arranged above light-emitting surfaces of the light-emitting elements.

FIG. 10B shows a cross-sectional view of the lighting device 105 taken along a line X-X shown in FIG. 9. The lighting device 105 includes a retention member in which light-emitting elements 12 are arranged and a light-transmitting resin 16 that is transparent or translucent is filled to entirely seal the light-emitting elements 12. The lighting device 105 further includes a phosphor cover 1 with a spiral surface 1b that is arranged on an upper surface of the light-transmitting resin 16 above light-emitting surfaces 10a of the light-emitting elements 12.

Figure 11A:
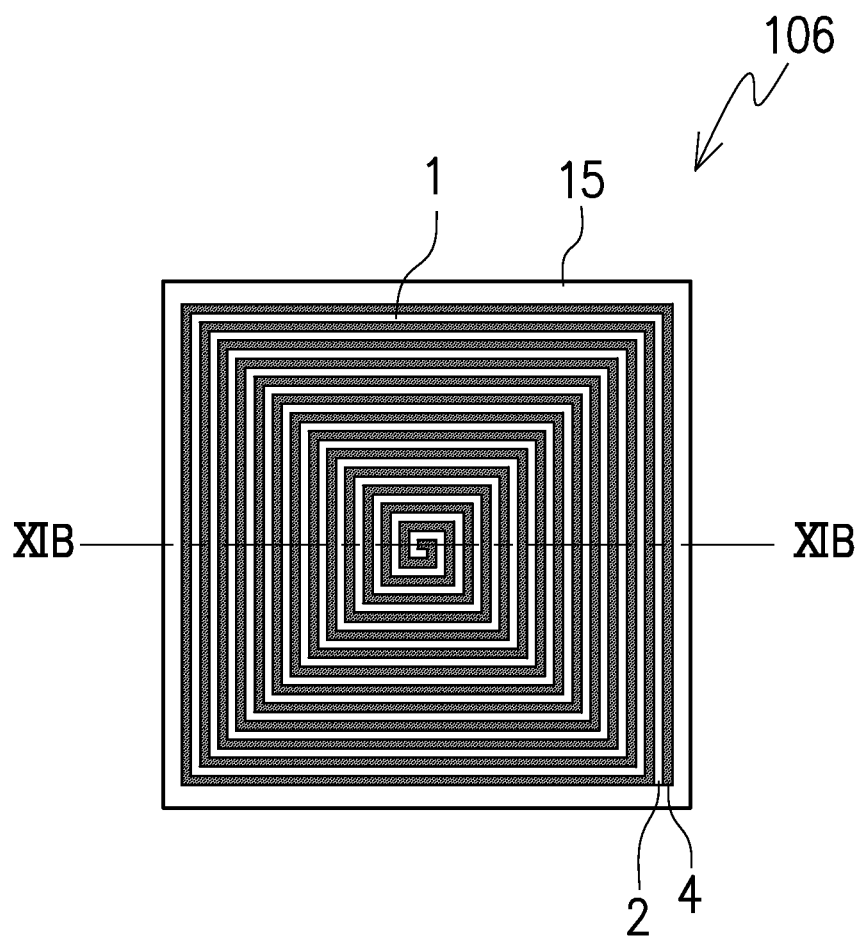
FIG. 11A shows a plan view of a lighting device.

FIG. 11A shows a plan view of a lighting device 106.

Figure 11B:
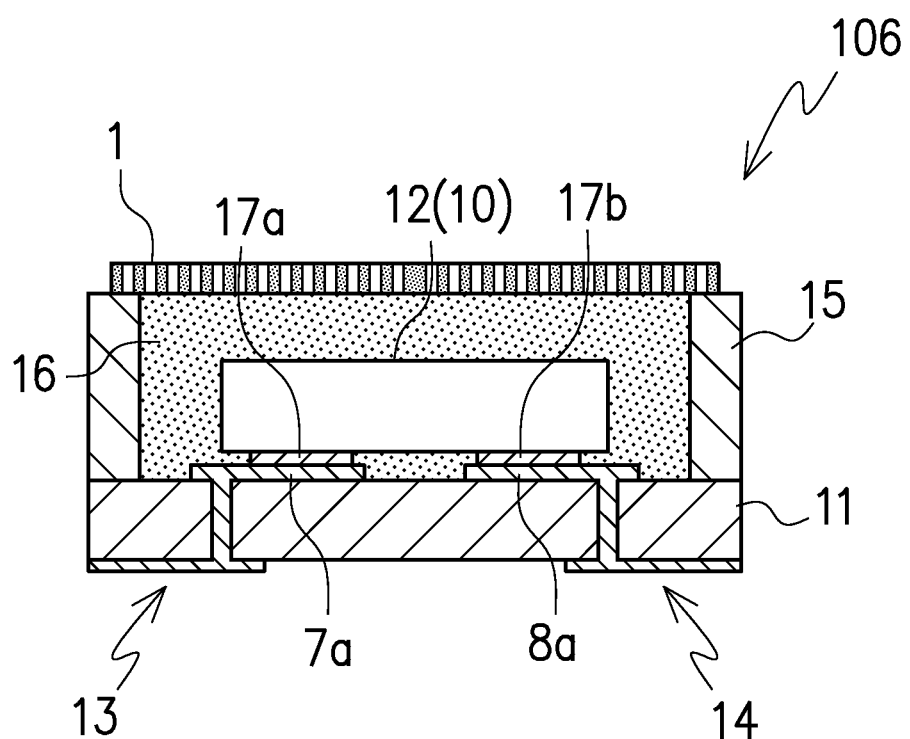
FIG. 11B shows a cross-sectional view of the lighting device 106 shown in FIG. 11A.

FIG. 11B shows a cross-sectional view of the lighting device 106 including a light-emitting element 12 as a light source 10 electrically mounted on a substrate 11, a retention member 15 that has a shape of frame and is arranged on the substrate 11 to retain a light-transmitting resin 16 sealing the light-emitting element 12, and a phosphor cover 1 arranged above the light-emitting element 12. The light-transmitting resin 16 may be made of silicone resin.

Figure 12A:
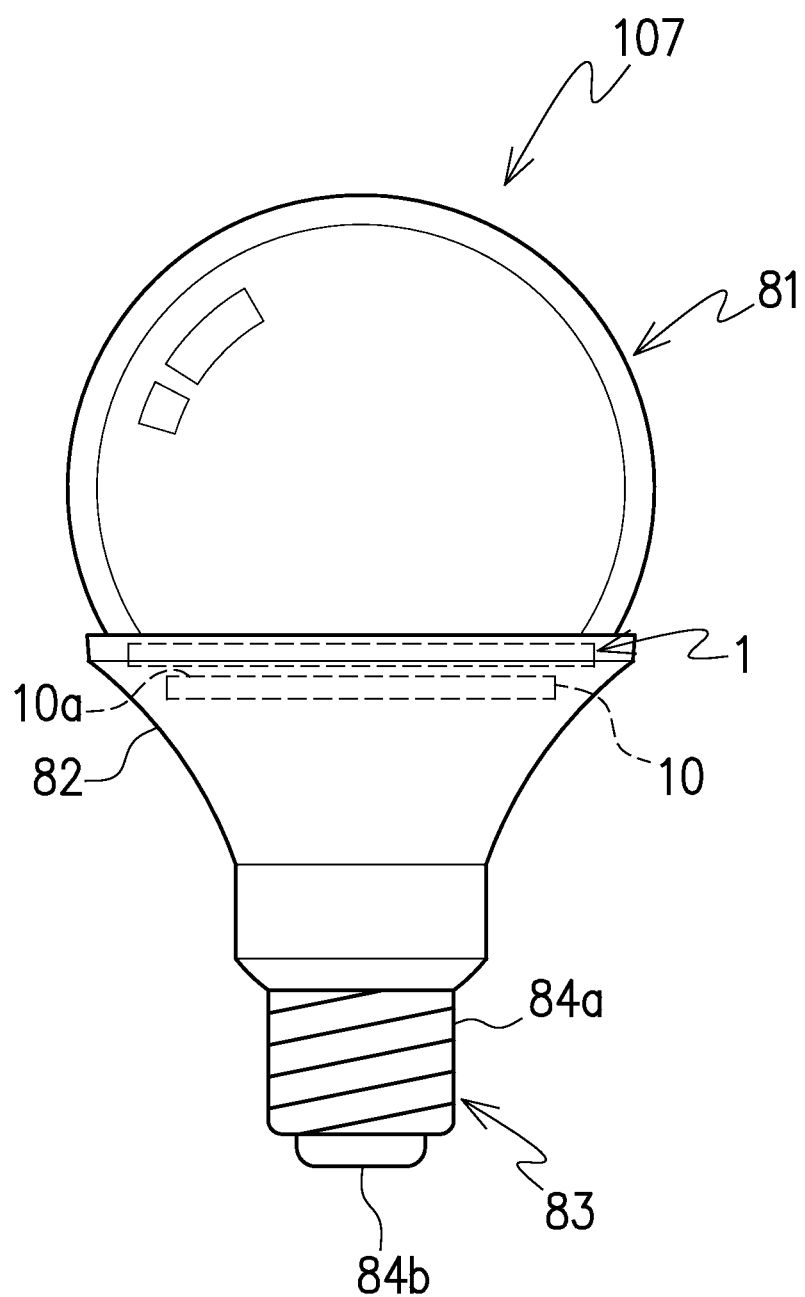
FIG. 12A shows a lighting device as a lighting bulb. The lighting device includes a light source, a phosphor cover facing a light-emitting surface of the light source, and a holder supporting the light source.

FIG. 12A shows a lighting device 107 as a lighting bulb. The lighting device 107 includes a light source 10, a phosphor cover 1 facing a light-emitting surface 10a of the light source 10, and a holder 82 supporting the light source 10. The light source 10 may include light-emitting elements 12 arranged in a circular or square region of a substrate 11. The light-emitting elements 12 may be arranged in lines that can be arranged to be parallel with each other in the region. Also, the light-emitting elements 12 may be arranged over the substrate 11 in a zigzag form and/or randomly. The light-emitting elements 12 mounted on the substrate 11 are electrically connected to the terminal electrodes 13a and 13b that are arranged on the substrate 11.

The lighting device 107 further includes a base 83 that is positioned below the light source 10 to supply electrical current to the light source 10. In this embodiment, the base may be a bayonet cap 83 that is positioned under the holder 82 and includes a pair of terminals 84a and 84b. The holder 82 may house a control circuit that can control supply of electrical current to the light source 10. The holder 82 may support the light source 10 and a phosphor cover 1 above the light source 10. Electrical current will be supplied to the first electrode 13a and the second electrode 13b arranged on the substrate 11 through the terminals 84a and 84b from a power source outside of the lighting device 107. The light-transmitting cover 81 can have a semispherical shape. The light-transmitting cover 81 may be made of glass and/or resin.

Figure 12B:
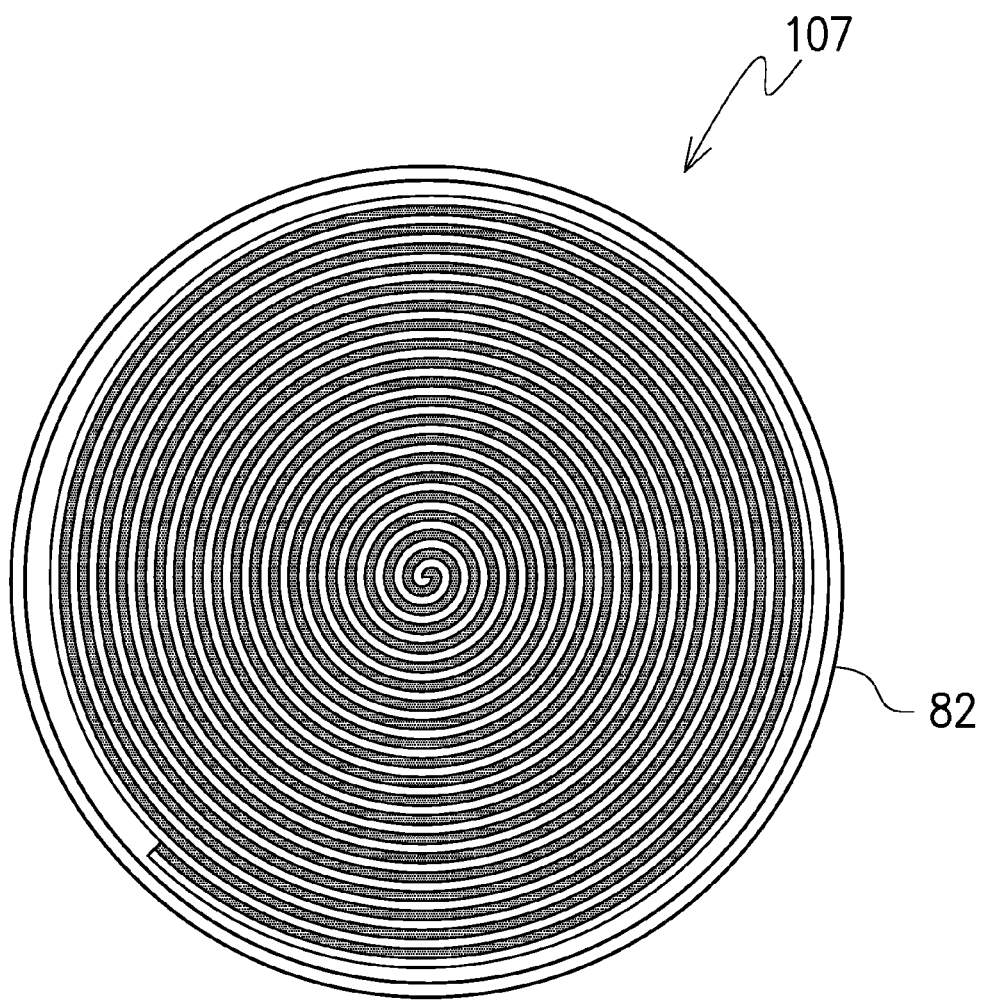
FIG. 12B shows a top plan view of the lighting device shown in FIG. 12A, with a light-transmitting cover removed.

FIG. 12B shows a top plan view of the lighting device 107 shown in FIG. 12A and with a light-transmitting cover 81 removed. A phosphor cover 1 with a circular spiral shape is used as an example here, but also it is possible to arrange a phosphor cover of another embodiment shown in FIGS. 1A-1F, for example.

Figure 13A:
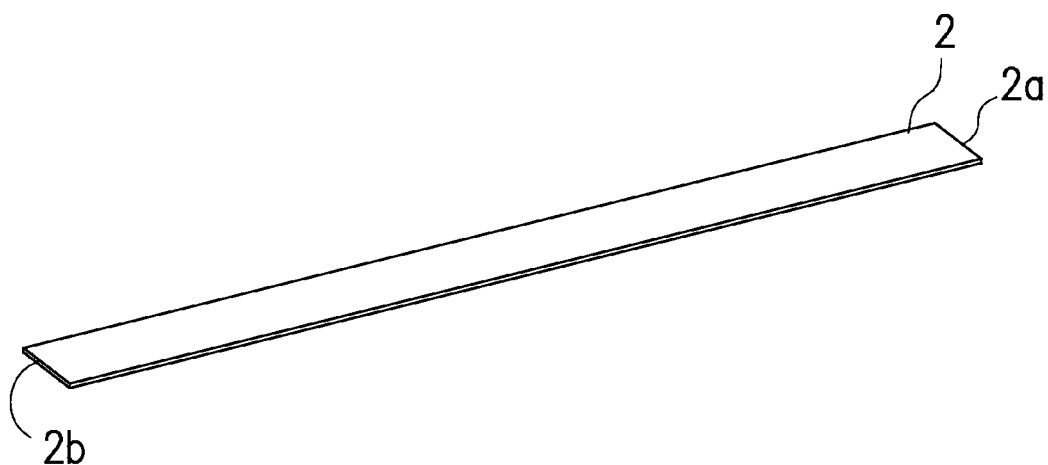
FIG. 13A shows a phosphor film containing a phosphor. The phosphor film may have a shape of strip or tape.
Figure 13B:
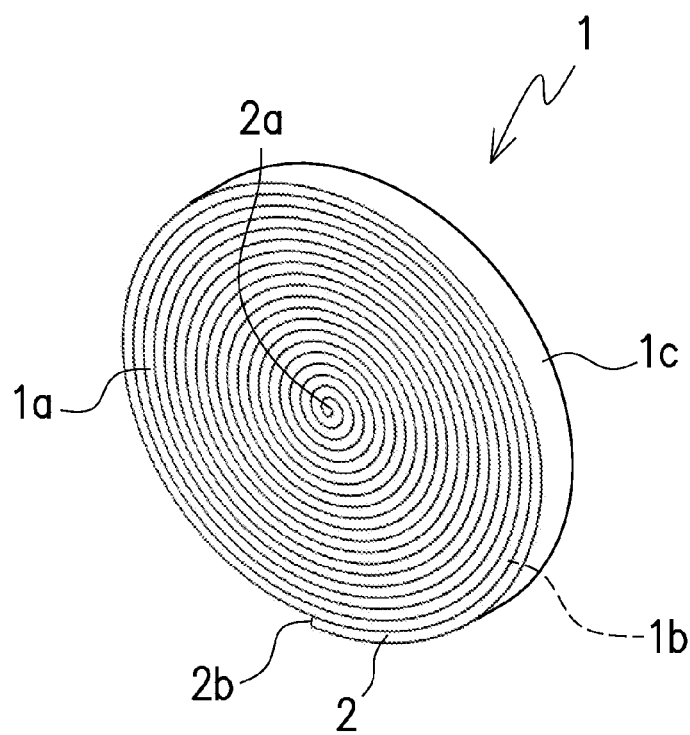
FIG. 13B shows the phosphor film that is rolled up from one end of the phosphor film shown in FIG. 13A to the other end of the phosphor film.
Figure 13A:
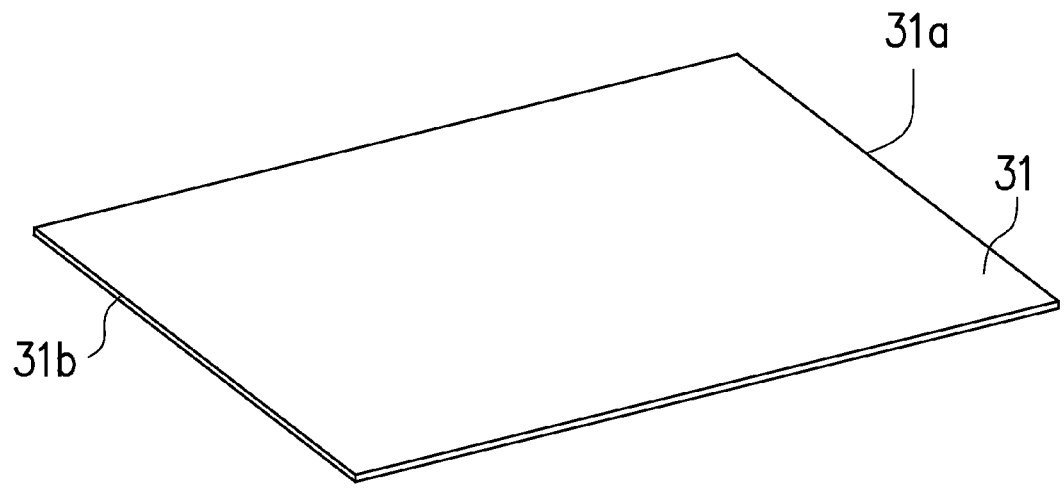
Figure 13B:
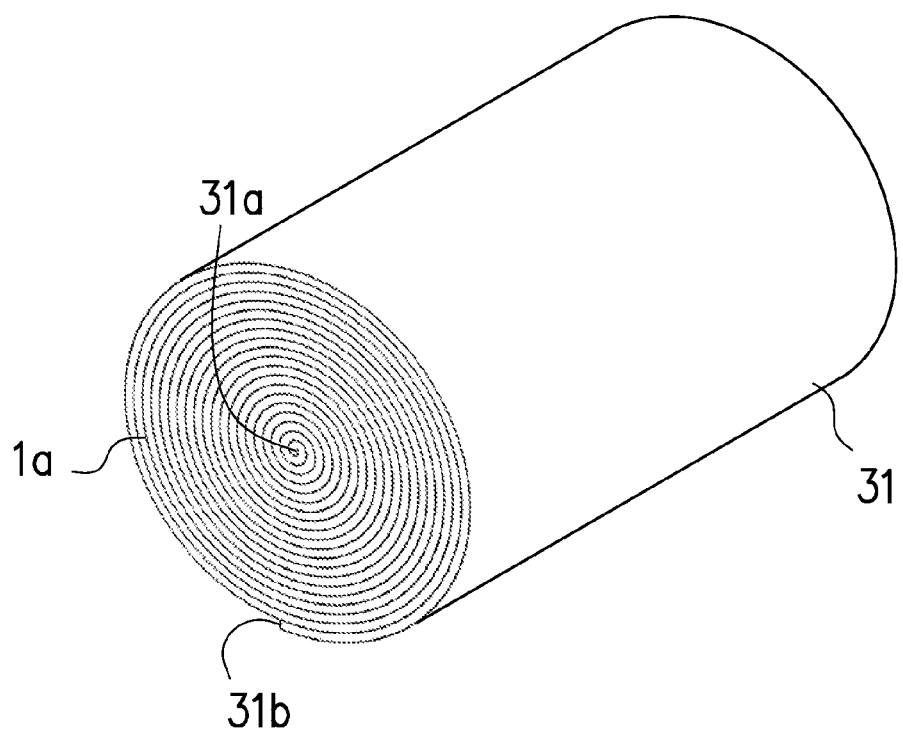
Figure 13B:
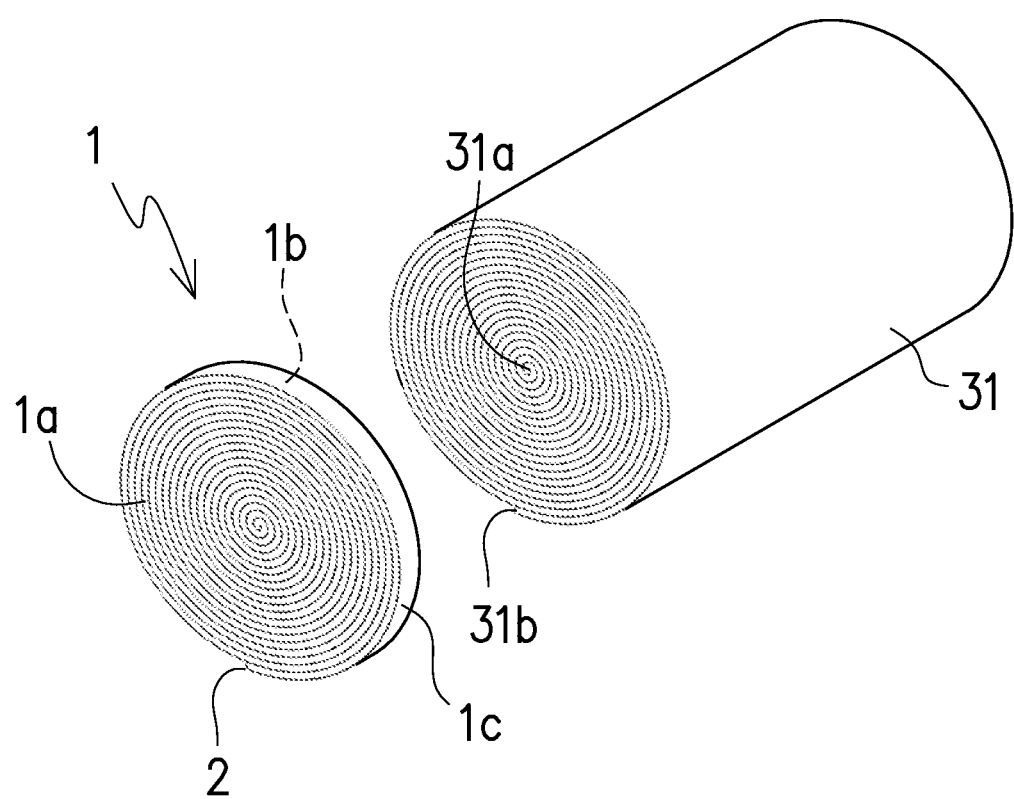

FIG. 13A and FIG. 13B shows a method manufacturing a phosphor cover 1. The method includes: providing a phosphor film 2; rolling up the phosphor film 2 to form the phosphor cover 1 including spiral surfaces 1a, 1b at opposite sides of the phosphor cover 1. The phosphor film 2 may be a phosphor strip or a phosphor tape with an adhesion layer on a surface of the phosphor. A first end 2a of the phosphor strip is positioned in a center of the spiral surfaces 1a, 1b and a second end 2b of the phosphor strip is positioned on a peripheral side surface 1c of the phosphor cover 1. When rolling up the one or more phosphor layers to form spiral surfaces, the number of rotation of the phosphor layers is selectable according to the size of the light-emitting surface of the light source. The rolled up phosphor film may be fixed by an adhesion to keep the spiral shape. The adhesion may be applied to at least one end of the two opposite ends of the one or more phosphor layers. Also, the adhesion may be applied to a surface of the one or more phosphor layers.

FIG. 13B shows the phosphor film 2 that is rolled up from one end 2a of the phosphor film 2 to the other end 2b in a longitudinal direction of the phosphor film 2. In this embodiment, a width direction of the phosphor film 2 is equal to a thickness of the phosphor cover 1.

Furthermore, the phosphor film 2 may be rolled up and formed to have a shape of circle by thermal-compression bonding. In this case, for example, if the phosphor film has a storage elastic modulus at 100 degrees Celsius (° C.) of less than 0.1 Mpa, thermal compression bonding is applicable to the phosphor film at a temperature range of 100 to 250 degrees Celsius (° C.).

FIG. 13A shows a phosphor film 2 containing a phosphor. In this embodiment, the phosphor film 2 may have a shape of strip or tape. The phosphor cover 1 includes a light-transmitting resin. The light-transmitting resin may be transparent resin or translucent resin. The light-transmitting resin may be at least partly made of silicone resin that is more heat-stable compared to epoxy resin, for example. The silicone resin may be curable silicone rubber. The curable silicone rubber may be silicone rubber with hydrosilylation reaction in response to a catalyst. Such silicone rubber with hydrosilylation reaction can have benefits in that cure shrinkage is less, and free from chemical by-product caused by curing reaction.

The silicone resin may contain particles of one or more phosphors. The weight of phosphor particles contained in the light-transmitting resin may be 50-80 percentage weight of the entire weight of the phosphor cover. However, the percentage weight of the phosphor is selectable according to a desired chromaticity and/or a desired brightness.

The phosphor cover may include a light-transmitting resin and particles of one or more phosphors, and also, the phosphor cover may further include solvent media of toluene and/or acetone. Furthermore, the phosphor cover may include a diffusing agent and/or ultraviolet absorbing agent.

FIG. 13B shows the phosphor film 2 that is rolled up from one end 2a of the phosphor film 2 to the other end 2b of the phosphor film 2. When rolling up phosphor film 2 to form spiral surfaces 1a, 1b that are opposite to each other, the number of rotation of the phosphor film 2 is selectable, according to the size of the light-emitting surface 10a of the light source 10, for example.

Figure 13C:
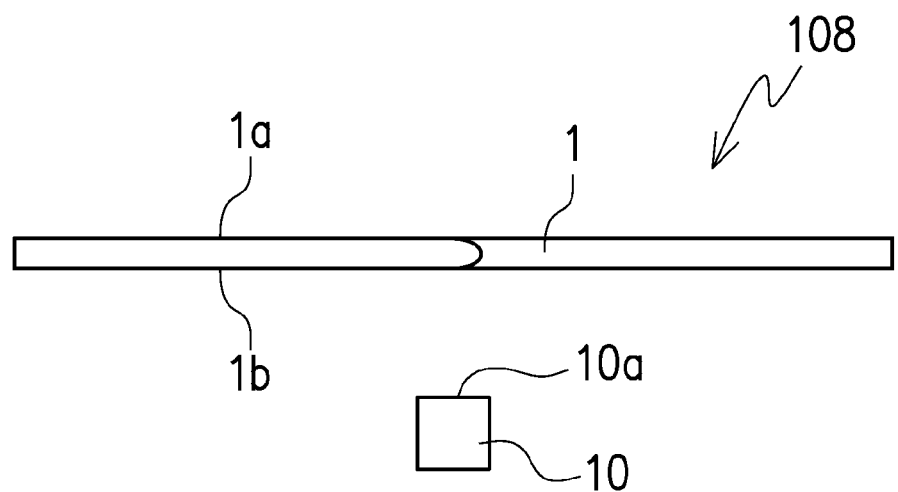
FIG. 13C shows a schematic side view of a lighting device including a phosphor cover and a light source with a light-emitting surface spaced away from a spiral surface of the phosphor cover.

FIG. 13C shows a schematic side view of a lighting device 108 including a phosphor cover 1 and a light source 10 with a light-emitting surface 10a spaced away from a spiral surface 1b of the phosphor cover 1. The method further includes: arranging the phosphor cover 1 above a light source 10.

Figure 13D:
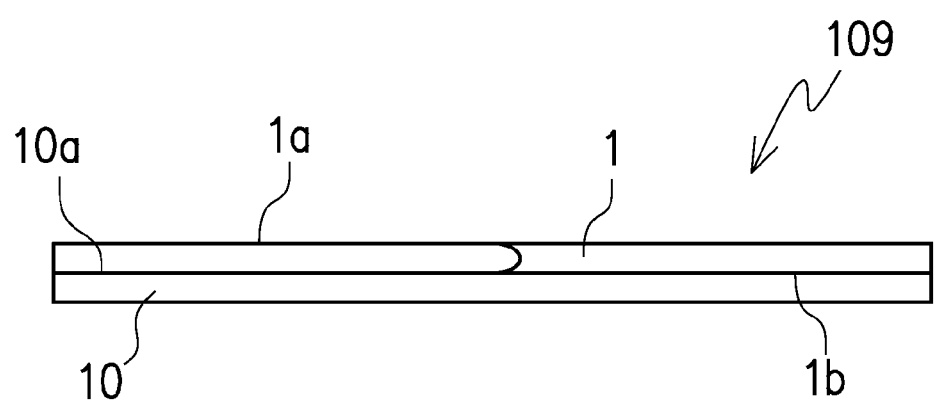
FIG. 13D is a schematic side view of a lighting device including a phosphor cover and a light source with a light-emitting surface arranged in contact with a spiral surface of the phosphor cover.

FIG. 13D is a schematic side view of a lighting device 109 including a phosphor cover 1 and a light source 10 with a light-emitting surface 10a arranged directly in contact with a spiral surface 1b of the phosphor cover 1.

The rolled up phosphor film 2 may be fixed by an adhesion to keep a spiral shape. The adhesion may be applied to at least one end of the two opposite ends 31a, 31b or a surface of the phosphor film 31.

FIG. 13A' shows a phosphor film 31 that is larger than one phosphor cover 1 if the phosphor cover 1 is extended. When rolling up the one or more phosphor layers to form spiral surfaces, the number of rotation of the phosphor layers is selectable according to the size of the light-emitting surface of the light source. Also, when dividing the roll of one or more phosphor layers, a desired thickness of phosphor cover is selectable according to intensity of light from a light source, required design of the light source, and so on.

FIG. 13B'-1 shows the phosphor film 31 that is rolled up from one end of the phosphor film 2 to the other end of the phosphor film 2 to form a roll of the phosphor film 31.

FIG. 13B'-2 shows dividing the roll of the phosphor film 31 into one or more phosphor covers 1.

A method manufacturing a phosphor cover 1 including: providing a phosphor film 31; rolling up the phosphor film 31 to form the phosphor cover including spiral surfaces at opposite ends of the phosphor cover 1.

Also, a method manufacturing a lighting device including: providing a phosphor film 31; rolling up the phosphor film 31 to form the phosphor cover 1 including spiral surfaces at opposite end of the phosphor cover; and arranging the phosphor cover above a light-emitting surface 10a of a light source 10.

The method includes: forming a phosphor film by applying a solution that includes a light-transmitting resin and a phosphor to a surface of a support. Roller coating and/or screen printing may be available to apply the solution to the surface of the support. The support may include a flat and/or a curving surface. The support may be made of metal. The support may be an aluminum plate, copper plate, and/or iron plate. Also, the support may be made of glass, and/or ceramic. Since a phosphor cover 1 is formed by rolling up at least one film, a thickness of the at least one film may be in a range of approximately 50-150 micrometer (μm). Please note that a thickness of the at least one film affects brightness and/or color tone of light from a lighting device, the thickness of the at least one film can be decided depending on design specifications of the lighting device.

The method further includes: drying the phosphor film on the surface of the support within a range of temperature 100-200 degree Celsius (° C.) for a time range of about two minutes to 180 minutes. The phosphor film may be dried by a hot-air dryer and/or infrared dryer. After the phosphor film is at least partly or wholly dried up, the phosphor film is peeled from the surface of the support.

The phosphor film made by the above method may have a storage elastic modulus at 25 degrees Celsius (° C.) of 0.1 Mpa or more and may have a storage elastic modulus at 100 degrees Celsius (° C.) of less than 0.1 Mpa. If the phosphor film has a storage elastic modulus at 25 degrees Celsius (° C.) of 0.1 Mpa or more, press work and/or cut process is applicable to the phosphor film at room temperature. Also, if the phosphor film has a storage elastic modulus at 100 degrees Celsius (° C.) of less than 0.1 Mpa, thermal compression bonding is applicable to the phosphor film at a temperature range of 60 to 250 degrees Celsius (° C.).

Figure 14A:
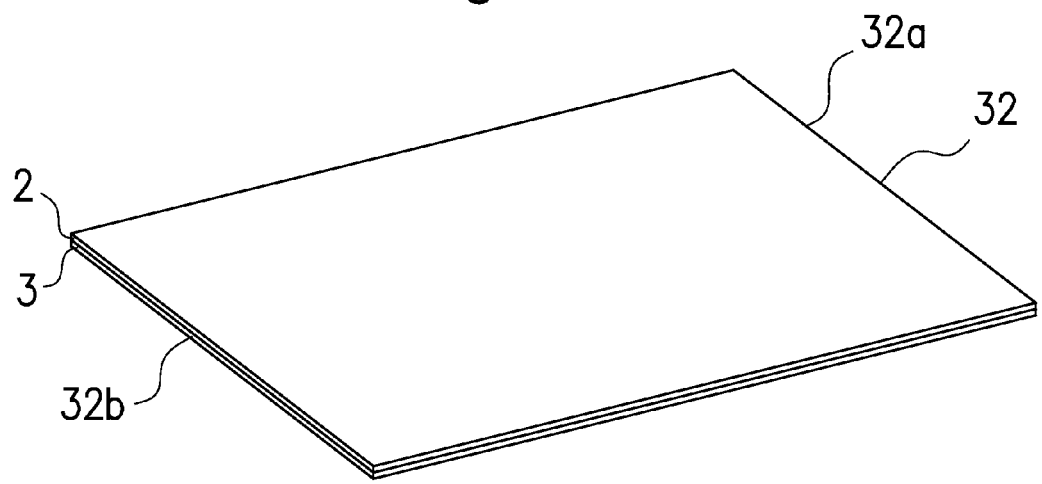
FIG. 14A shows a phosphor film containing a phosphor and a light-reflection layer layered on a surface of the phosphor film to be integrated.

FIG. 14A shows a phosphor film 2 containing a phosphor and a light-reflection layer 3 layered on a surface of the phosphor film 2 to be integrated.

Figure 14B:
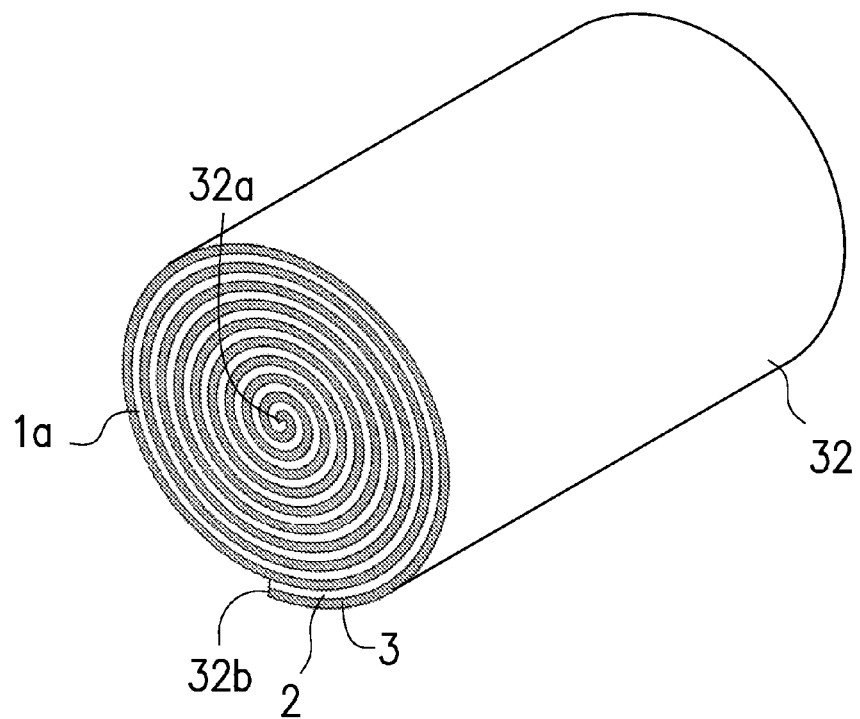
FIG. 14B shows a roll of the layered light-reflection layer and phosphor film 2.

FIG. 14B shows a roll of the light-reflection layer 3 layered on the phosphor film 2.

Figure 14C:
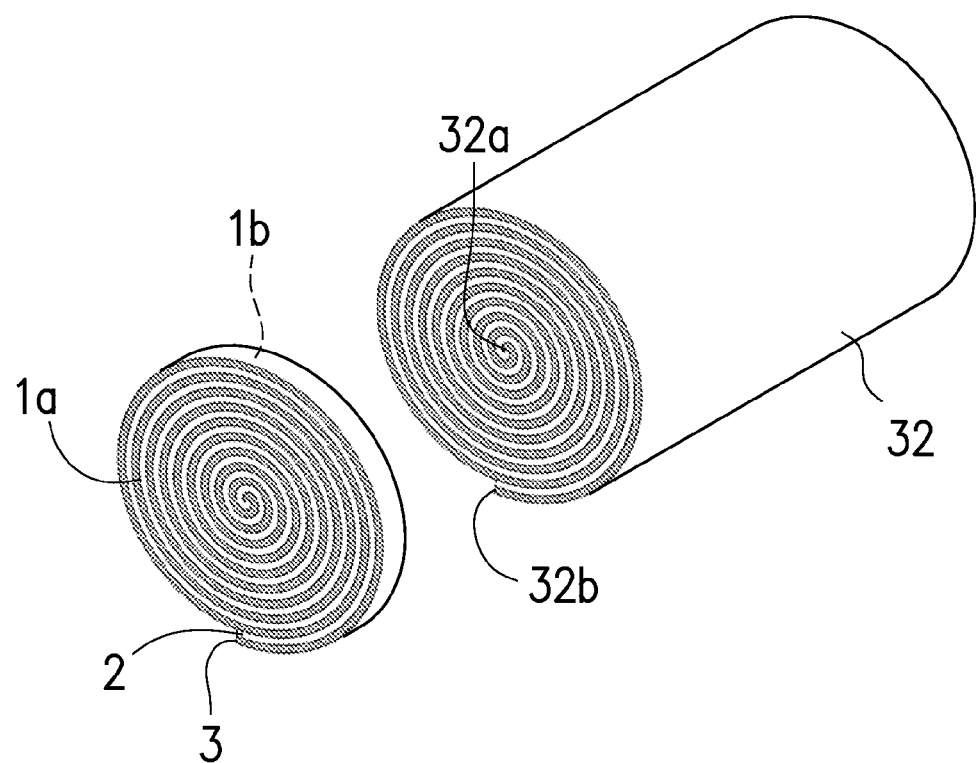
FIG. 14C shows dividing the roll of the layered light-reflection layer and the phosphor film into one or more phosphor covers.

FIG. 14C shows dividing the roll of the light-reflection layer 13 layered on the phosphor film 2.

Figure 15A:
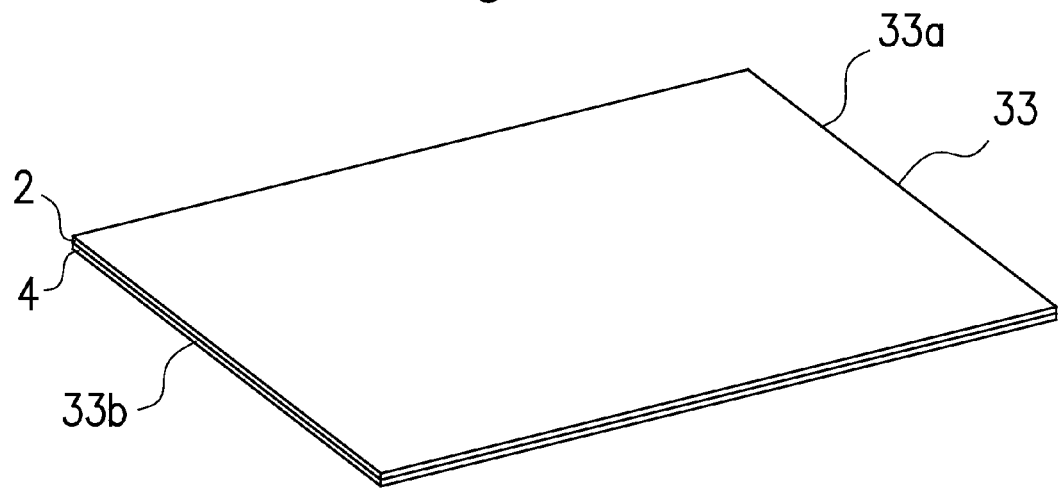
FIG. 15A shows a first phosphor film 2 containing a first phosphor and a second phosphor film containing a second phosphor layered on a surface of the first phosphor film 2 to be integrated.

FIG. 15A shows a first phosphor film 2 containing a first phosphor and a second phosphor film 3 containing a second phosphor layered on a surface of the first phosphor film 2 to be integrated.

Figure 15B:
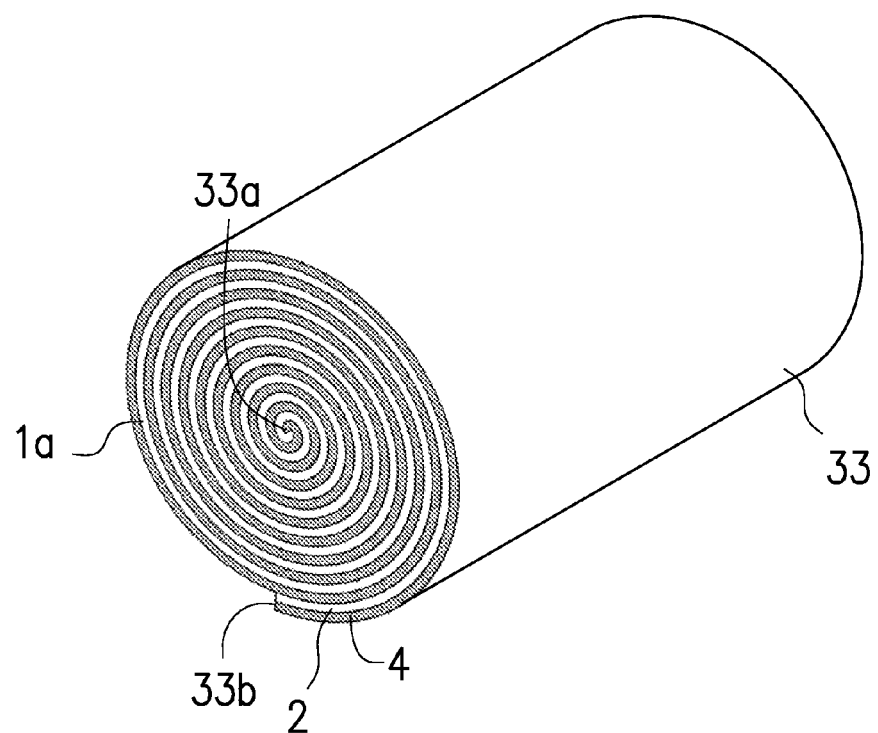
FIG. 15B shows a roll of the layered first phosphor film and second phosphor film.

FIG. 15B shows a roll of the first phosphor film 2 layered on the second phosphor film 3.

Figure 15C:
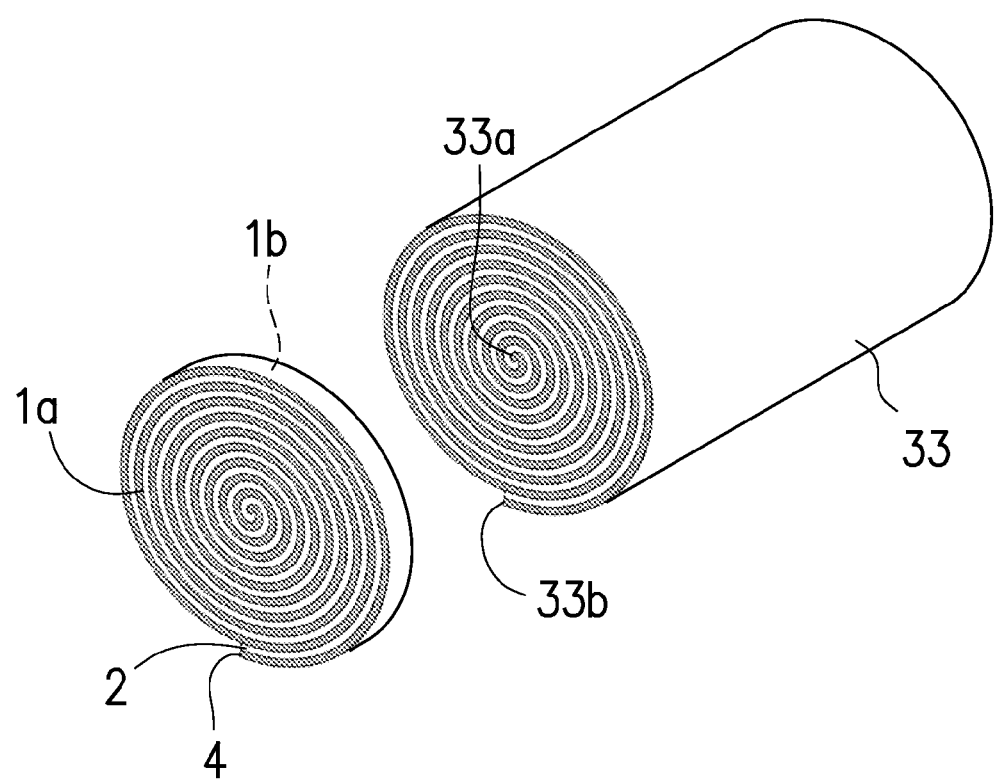
FIG. 15C shows dividing the roll of the layered first phosphor film and the second phosphor film.

FIG. 15C shows dividing the roll of the first phosphor film 2 and the second phosphor film 4.

Figure 16A:
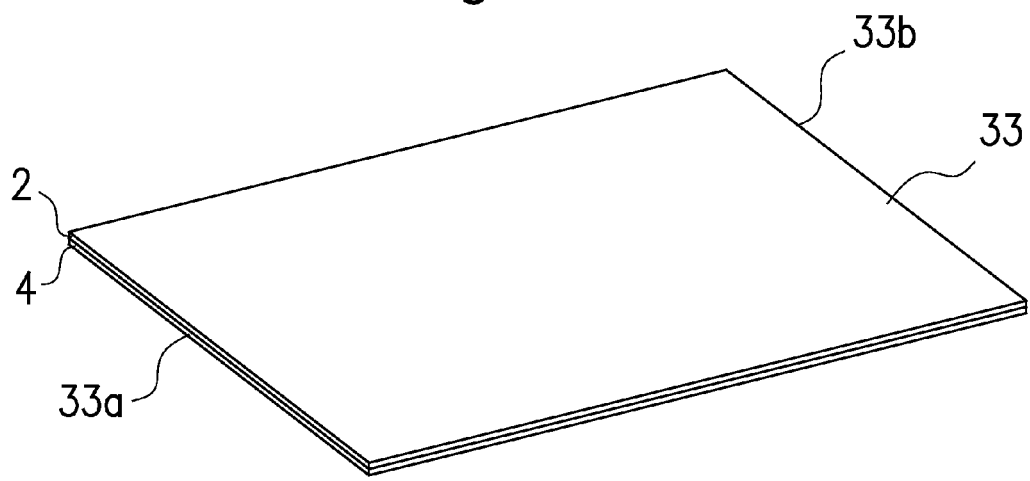
FIG. 16A shows a first phosphor film containing a first phosphor and a second phosphor film that contains a second phosphor and is layered on a surface of the first phosphor film to be integrated.

FIG. 16A shows a first phosphor film 2 containing a first phosphor and a second phosphor film 4 containing a second phosphor layered on a surface of the first phosphor film 2 to be integrated.

Figure 16B:
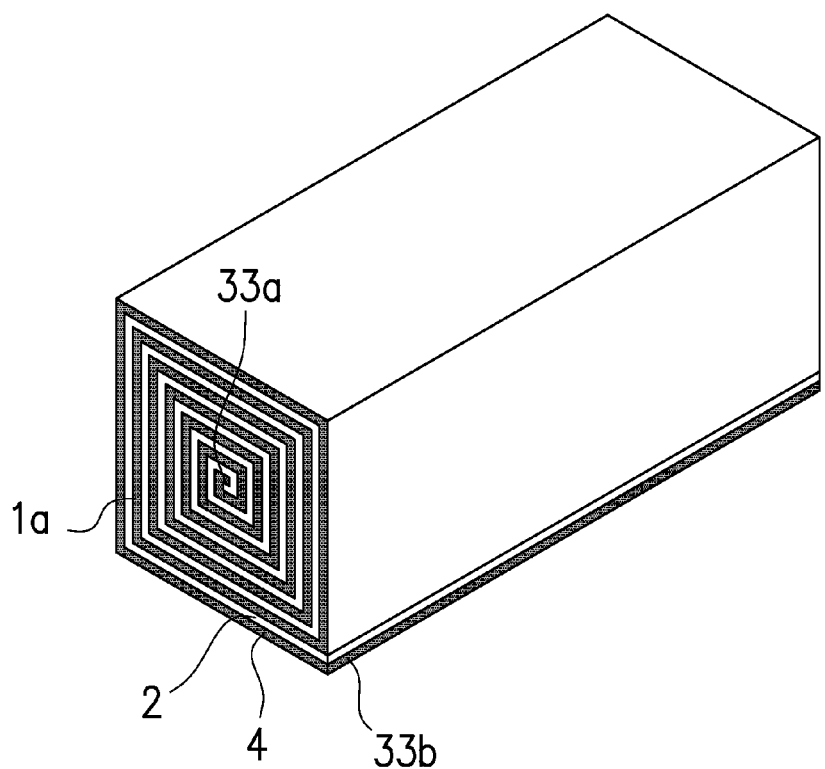
FIG. 16B shows a roll (square) of a first phosphor film layered on a second phosphor.

FIG. 16B shows a roll (square) of the first phosphor film 2 layered on the second phosphor 4.

Figure 16C:
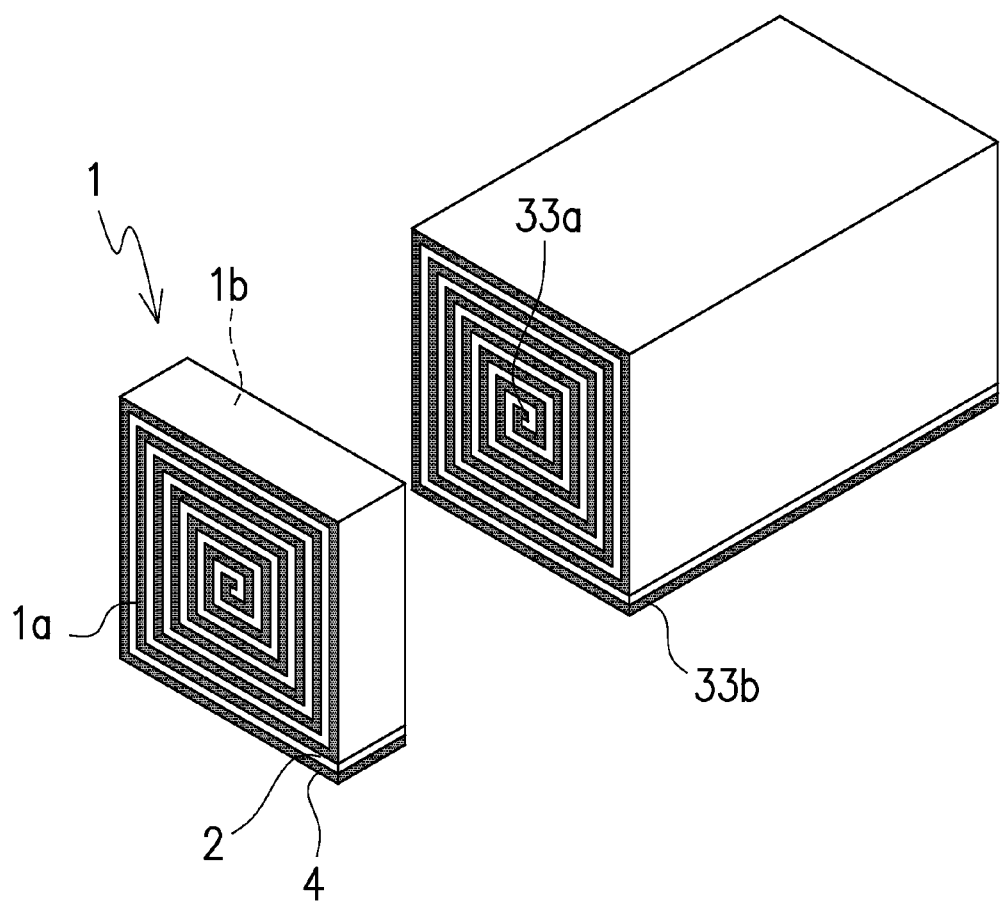
FIG. 16C shows dividing the roll of the layered first phosphor film and second phosphor film into one or more phosphor covers.

FIG. 16C shows dividing the roll of the first phosphor film 2 and the second phosphor film 4.

Figure 17A:
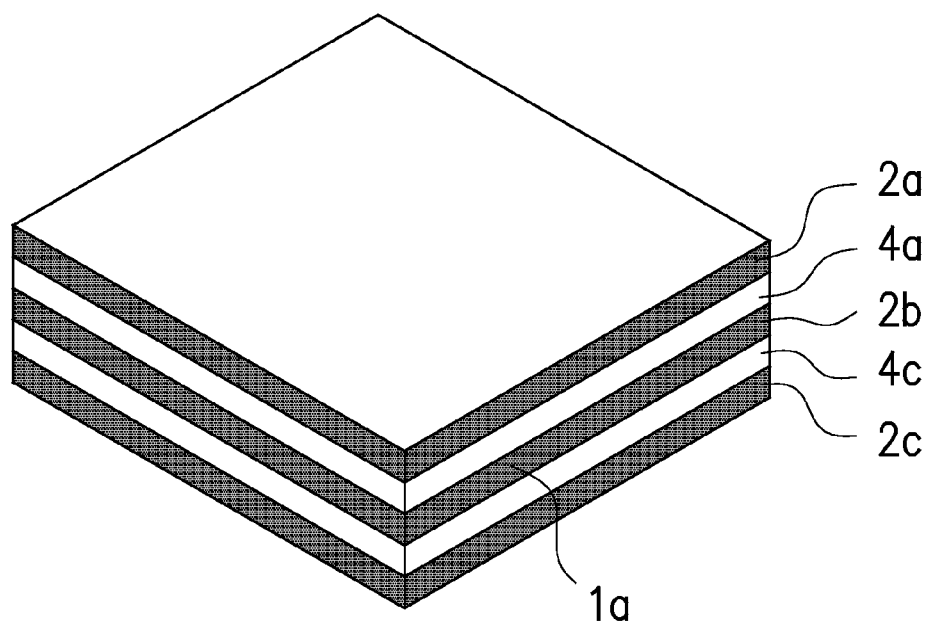
FIG. 17A shows layers of first phosphor film 2 and layers of the second phosphor film, which are stacked alternately and integrated by thermo-press and/or adhesion etc.
Figure 17B:
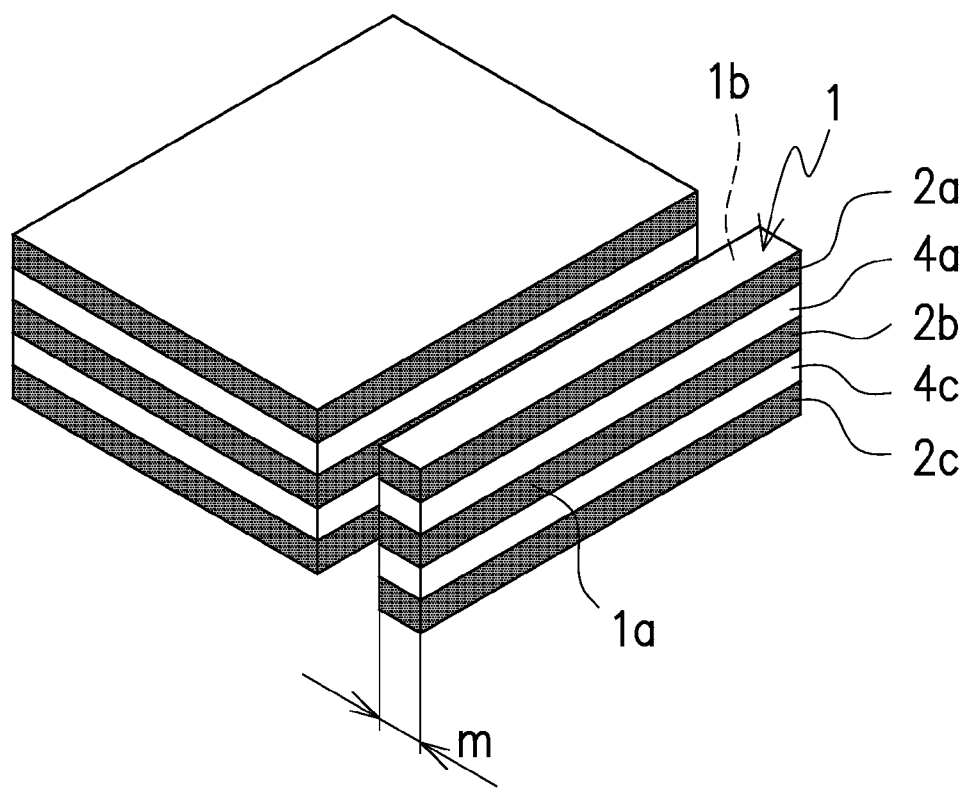
FIG. 17B shows dividing the stack of the first phosphor film and the second phosphor film into one or more phosphor covers.

FIGS. 17A-17B show another embodiment of method manufacturing a phosphor cover. The method manufacturing the phosphor cover 1 includes: alternately stacking layers 2a, 2b, 2c of a first film 2 that includes a first phosphor and layers 4a, 4c of a second film 4 that includes a second phosphor to form a phosphor cover. In this embodiment, the phosphor cover 1 includes a striped surface 1a of the first film 2 and the second film 4. As shown in FIG. 17B, the method further includes: dividing the alternately stacked layers of the first film 2 and the second film 4 in parallel with the striped surface 1a into one or more phosphor covers 1. The phosphor cover 1 includes striped surfaces 1a, 1b opposite to each other.

FIGS. 17A-18B show another embodiment of method manufacturing a lighting device. The method manufacturing the lighting device 108 includes: alternately stacking layers 2a, 2b, 2c of the first film that includes a first phosphor and layers 4a, 4c of a second phosphor film 4 that includes a second phosphor to form a phosphor cover, as shown in FIG. 17A. FIG. 17A shows layers of first phosphor film 2 and layers of the second phosphor film 4 that are stacked alternately and integrated by thermo-press, and/or adhesion etc. The method further includes: dividing the alternately stacked layers of the first film 2 and the second film 4 in parallel with the striped surface 1a into one or more phosphor covers 1, and arranging the phosphor cover 1 with a striped surface that faces a light-emitting surface of the light source 10.

Figure 18A:
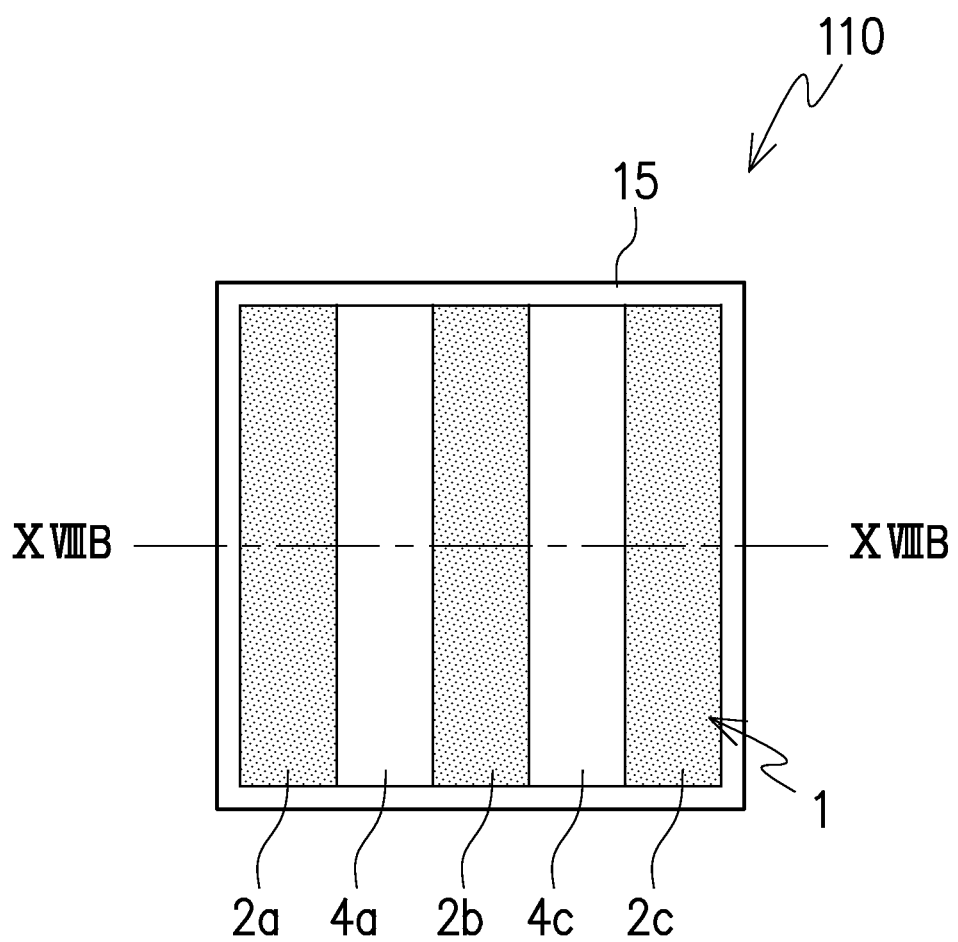
FIG. 18A shows a top plan view of a lighting device including a light source and a phosphor cover arranged to face the light source.

FIG. 18A shows a top plan view of a lighting device 110 including a light source and a phosphor cover 1 arranged to face the light source 10.

Figure 18B:
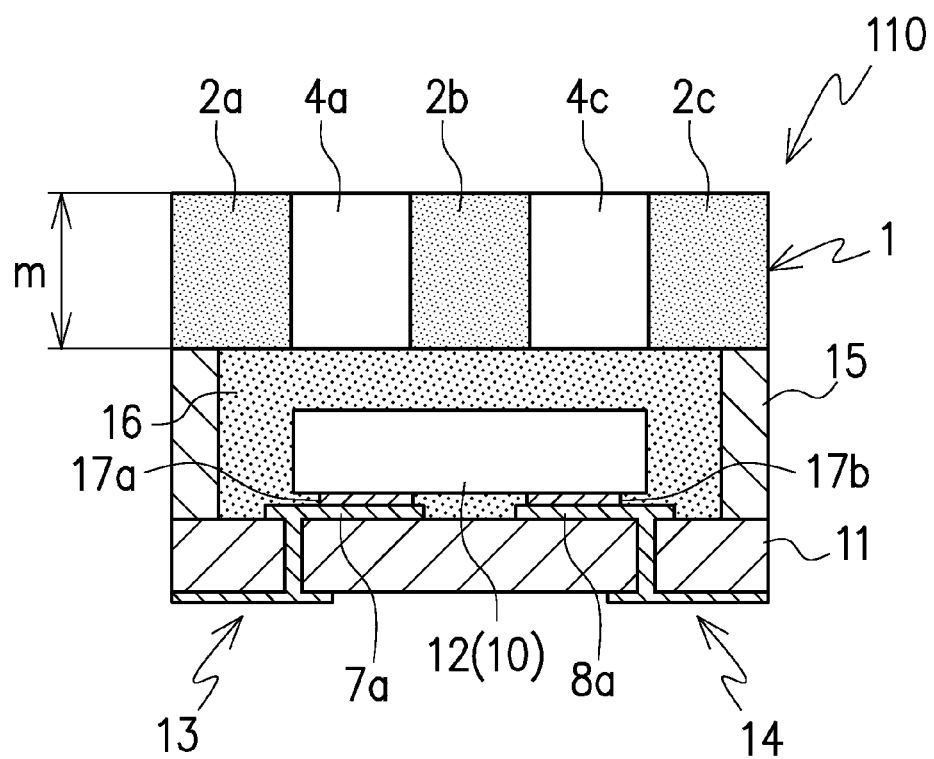
FIG. 18B shows a cross-sectional view of the lighting device taken along a line XVIIIB-XVIIIB shown in FIG. 18A.

FIG. 18B shows a cross-sectional view of the lighting device 110 taken along a line XVIII-XVIII shown in FIG. 18A.

Also, when dividing the stacked layers of one or more films, a desired thickness m of phosphor cover 1 is selectable according to intensity of light from a light source, required design of the light source, and so on.

Figure 19A:
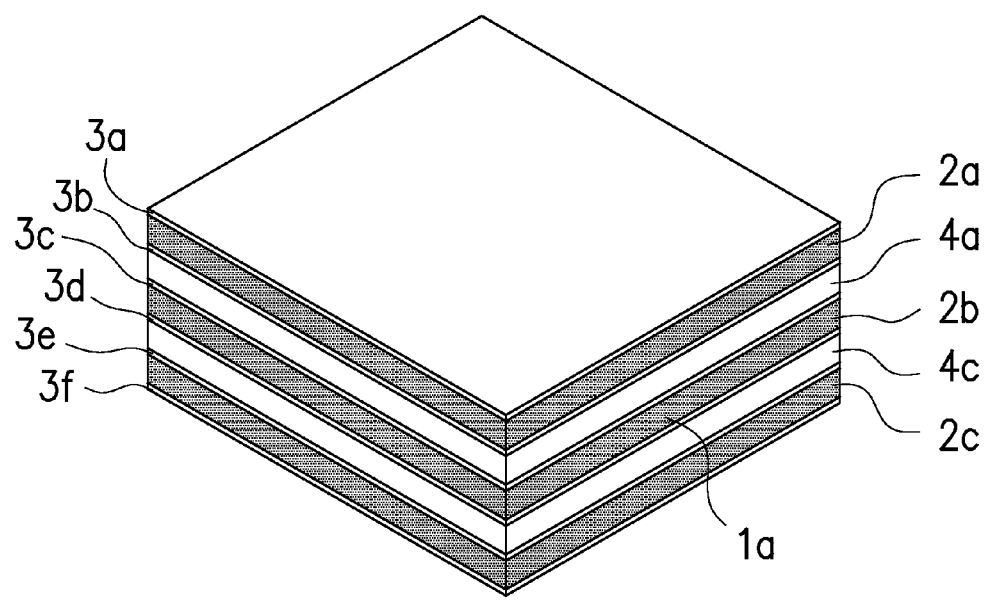
FIG. 19A shows layers of light reflector and layers of first phosphor and layers of second phosphor that are stacked alternately. The layers of the light reflector are also arranged as an uppermost layer and a lowermost layer.
Figure 19B:
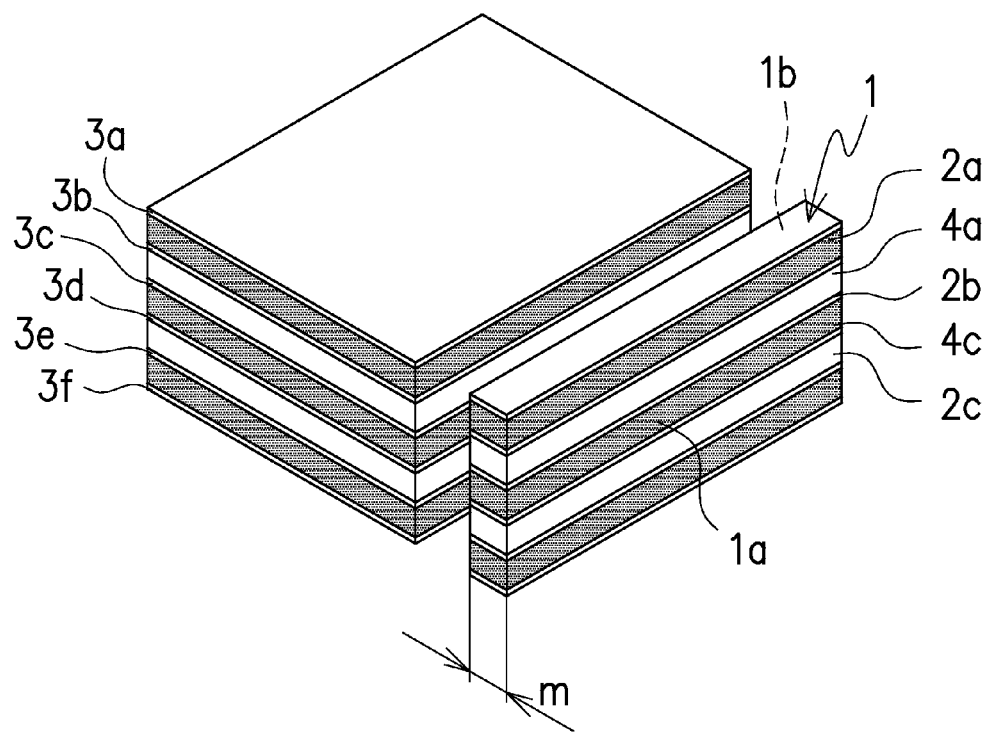
FIG. 19B shows dividing the stack of the light reflector and the first phosphor film and the second phosphor film into one or more phosphor covers.

FIGS. 19A-19B show further embodiment of method manufacturing a phosphor cover 1. The method manufacturing the phosphor cover 1 in this embodiment includes: alternately stacking layers 2a, 2b, 2c of a first film 2 that includes a first phosphor and layers 4a, 4c of a second film 4 that includes a second phosphor and layers 3a, 3b, 3c, 3d, 3e, 3f of a third film 3 to form a phosphor cover 1. The layers 3a, 3b, 3c, 3d, 3e, 3f of the third film 3 are light-reflection layers. In this embodiment, the phosphor cover 1 includes a striped surface 1a of the first film 2, the second film 4, and the third film 3. The outermost layers 3a and 3f in a stacking direction are light-reflection layers to reflect light inward and/or upward above the striped surface 1a. As shown in FIG. 19B, the method further includes: dividing the alternately stacked layers 2a, 2b, 2c of the first film 2, the layers 4a, 4b of the second film 4, and the layers 3a, 3b, 3c, 3d, 3e, 3f in parallel with the striped surface 1a into one or more phosphor covers 1. The phosphor cover 1 includes striped surfaces 1a, 1b opposite to each other.

Figure 20A:
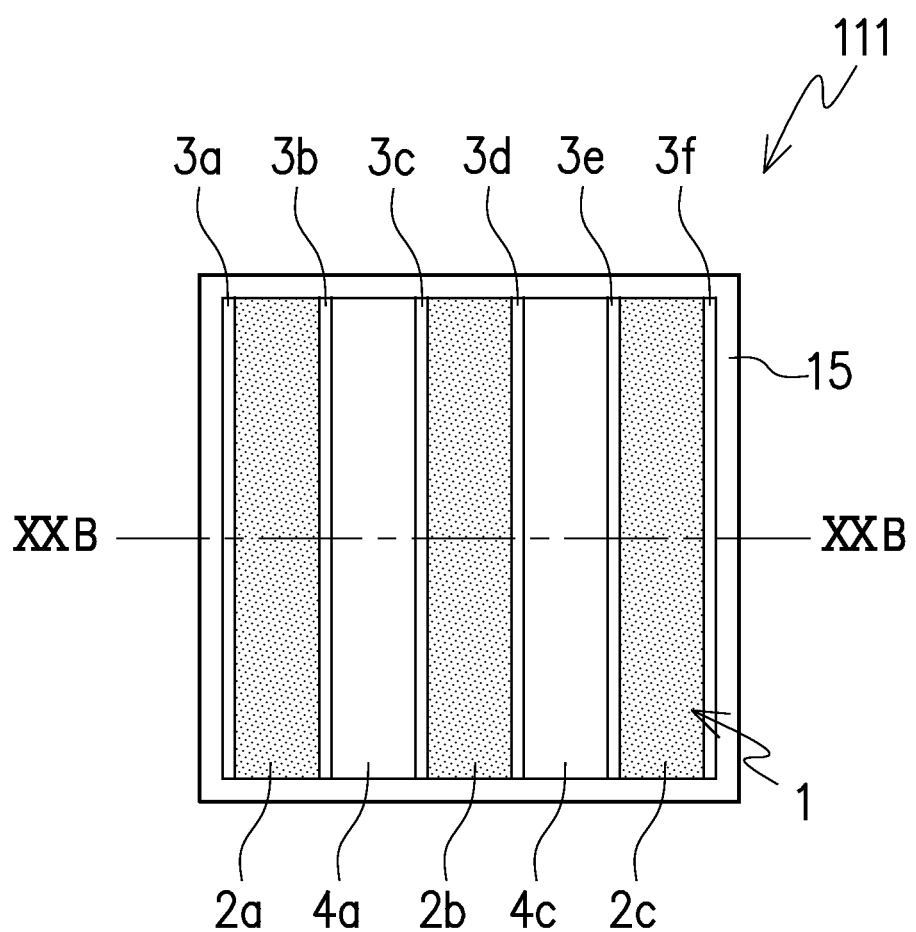
FIG. 20A shows a top plan view of a lighting device.

FIG. 20A shows a top plan view of a lighting device.

Figure 20B:
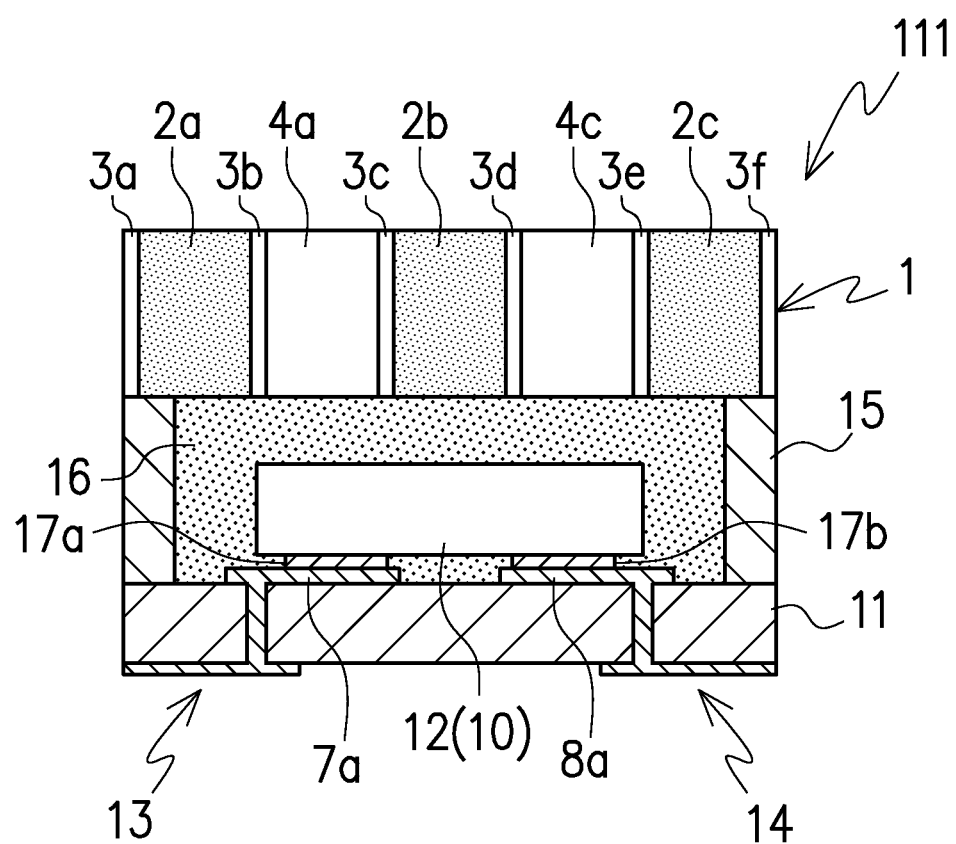
FIG. 20B shows a cross-sectional view of the lighting device taken along a line XXB-XXB shown in FIG. 20A.

FIG. 20B shows a perspective view of the lighting device 111 shown in FIG. 20A. Of course it is possible to combine a light source 10 selectable from various light sources and a phosphor cover 1 according to an embodiment of the present invention.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:
1. A lighting device comprising:
  a light source comprising a light-emitting surface, a substrate, and at least one light-emitting element arranged in a region of the substrate; and a phosphor cover comprising a spiral surface that covers the light-emitting surface of the light source,
wherein the phosphor cover is arranged above the light-emitting surface of the light source.

2. The lighting device according to claim 1,
wherein the phosphor cover comprises a phosphor layer that is spiral.

3. The lighting device according to claim 1,
wherein the phosphor cover comprises a phosphor layer and a light-reflection layer that is layered on a surface of the phosphor layer, and the light-reflection layer layered on the surface of the phosphor layer is spiraled around each other.

4. The lighting device according to claim 1,
wherein the phosphor cover comprises a first phosphor layer and a second phosphor layer that are layered, and the spiral surface includes the first phosphor layer and the second phosphor layer that are spiraled together.

5. The lighting device according to claim 1,
wherein the spiral surface of the phosphor cover is a circle spiral surface.

6. The lighting device according to claim 1,
wherein the spiral surface of the phosphor cover is a square spiral surface.

7. The lighting device according to claim 1,
wherein the phosphor cover is arranged in contact with the light-emitting surface of the light source.

8. The lighting device according to claim 1,
wherein the phosphor cover is arranged to be spaced from the light-emitting surface of the light source.

9. The lighting device according to claim 1,
wherein a light-emitting element included in the light source is configured to emit light with peak emission spectrum in a range of 350 nm to 500 nm.

10. A method manufacturing a lighting device comprising:
rolling up a phosphor film from one end to another end to form a roll with spiral surfaces both ends of the roll of the phosphor film.

11. The method manufacturing a lighting device according to claim 10 further comprising:
arranging the roll as a phosphor cover above a light source.

12. The method manufacturing a lighting device according to claim 10 further comprising:
dividing the roll in a direction parallel with the spiral surfaces into phosphor covers.

13. The method manufacturing a lighting device according to claim 11 further comprising:
arranging the phosphor cover above a light source.

14. A method manufacturing a lighting device comprising:
providing a first film;
placing a second film on the first film to be layered; and
rolling up the layered first and second films to form a roll with spiral surfaces.

15. The method manufacturing a lighting device according to claim 14 further comprising:
arranging the roll as a phosphor cover above a light source.

16. The method manufacturing a lighting device according to claim 14 further comprising:
dividing the roll in a direction parallel with the spiral surfaces into phosphor covers with the spiral surfaces.

17. The method manufacturing a lighting device according to claim 16 further comprising:
arranging one of the phosphor covers above a light source.

18. The method manufacturing a lighting device according to claim 14,
wherein the second film is a light-reflection film vapored on the first film to be layered.

19. The method manufacturing a lighting device according to claim 14,
wherein the first film is a first phosphor film including a red phosphor and the second film is a second phosphor film including a green phosphor.

20. A lighting device comprising:
a light source comprising a light-emitting surface; and
a phosphor cover comprising a spiral surface that is arranged above the light-emitting surface of the light source,
wherein the light-emitting surface of the light source is spaced away from the spiral surface of the phosphor cover.

21. A lighting device comprising:
a light source comprising a light-emitting surface; and
a phosphor cover comprising a spiral surface that is arranged above the light-emitting surface of the light source,
wherein the spiral surface of the phosphor cover comprises a first spiral surface that is arranged above the light-emitting surface of the light source,
wherein the spiral surface of the phosphor cover further comprises a second spiral surface that is opposite to the first spiral surface, and
wherein the light-emitting surface of the light source is directly in contact with the second spiral surface of the phosphor cover.

* * * * *